(12) United States Patent
Park et al.

(10) Patent No.: US 10,141,502 B2
(45) Date of Patent: Nov. 27, 2018

(54) SEMICONDUCTOR MEMORY DEVICES

(71) Applicants: Il-Mok Park, Seoul (KR); Dae-Hwan Kang, Seoul (KR); Gwan-Hyeob Koh, Seoul (KR)

(72) Inventors: Il-Mok Park, Seoul (KR); Dae-Hwan Kang, Seoul (KR); Gwan-Hyeob Koh, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/418,250

(22) Filed: Jan. 27, 2017

(65) Prior Publication Data
US 2017/0271580 A1  Sep. 21, 2017

(30) Foreign Application Priority Data

Mar. 15, 2016 (KR) .................. 10-2016-0030731

(51) Int. Cl.
| | |
|---|---|
| *H01L 47/00* | (2006.01) |
| *H01L 45/00* | (2006.01) |
| *H01L 27/22* | (2006.01) |
| *H01L 27/24* | (2006.01) |
| *H01L 43/02* | (2006.01) |
| *H01L 43/08* | (2006.01) |
| *H01L 43/10* | (2006.01) |

(52) U.S. Cl.
CPC ............ *H01L 45/06* (2013.01); *H01L 27/224* (2013.01); *H01L 27/2427* (2013.01); *H01L 43/02* (2013.01); *H01L 43/08* (2013.01); *H01L 43/10* (2013.01); *H01L 45/1233* (2013.01); *H01L 45/143* (2013.01); *H01L 45/144* (2013.01)

(58) Field of Classification Search
CPC ..................... H01L 45/1233; H01L 27/224
See application file for complete search history.

(56) References Cited

U.S. PATENT DOCUMENTS

| | | | |
|---|---|---|---|
| 8,546,231 B2 | 10/2013 | Pellizzer et al. | |
| 9,117,503 B2 | 8/2015 | Lee et al. | |
| 9,153,777 B2 | 10/2015 | Boniardi et al. | |
| 2013/0026439 A1* | 1/2013 | Bae .................. | H01L 45/06 257/4 |

(Continued)

OTHER PUBLICATIONS

US 8,981,336, 03/2015, Zanderighi et al. (withdrawn)

*Primary Examiner* — Samuel Gebremariam
(74) *Attorney, Agent, or Firm* — Muir Patent Law, PLLC

(57) ABSTRACT

Disclosed are a semiconductor memory device and a method of manufacturing the same. A first conductive line extends in a first direction on a substrate and has a plurality of protrusions and recesses that are alternately formed thereon. A second conductive line is arranged over the first conductive line in a second direction such that the first and the second conductive lines cross at the protrusions. A plurality of memory cell structures is positioned on the protrusions of the first conductive line and is contact with the second conductive line. A thermal insulating plug is positioned on the recesses of the first conductive line and reduces heat transfer between a pair of the neighboring cell structures in the first direction. Accordingly, the heat cross talk is reduced between the neighboring cell structures along the conductive line.

20 Claims, 35 Drawing Sheets

(56) References Cited

U.S. PATENT DOCUMENTS

| | | | |
|---|---|---|---|
| 2013/0126822 A1* | 5/2013 | Pellizzer | H01L 45/1233 257/5 |
| 2013/0256624 A1 | 10/2013 | Kau | |
| 2015/0028280 A1 | 1/2015 | Sciarrillo et al. | |
| 2015/0243708 A1 | 8/2015 | Ravasio et al. | |

* cited by examiner

SEMICONDUCTOR MEMORY DEVICES

CROSS-REFERENCE TO RELATED APPLICATIONS

This application claims priority under 35 U.S.C § 119 to Korean Patent Application No. 10-2016-0030731 filed on Mar. 15, 2016 in the Korean Intellectual Property Office, the contents of which are incorporated by reference herein in its entirety.

BACKGROUND

1. Field

Example embodiments relate to semiconductor devices and methods of manufacturing semiconductor devices, and more particularly, to non-volatile memory devices having a cross point cell array and methods of manufacturing the same.

2. Description of the Related Art

A flash memory device has an advantage of low manufacturing cost in that the same silicon-based manufacturing processes for DRAM devices may be applied to the flash memory manufacturing processes. However, the flash memory device has disadvantages of a relatively lower integration degree and operation speed together with relatively higher power consumption for storing data in comparison with the DRAM devices.

Thus, various next generation nonvolatile memory devices such as a PRAM (phase changeable RAM) device, an MRAM (magnetic RAM) device and a RRAM (resistive RAM) device have been suggested so as to overcome the above disadvantages of the flash memory devices. Most of the next generation nonvolatile memory devices have a lower power consumption, so a small access time and a large amount of the disadvantages of the nonvolatile memory devices can be solved or alleviated by the next generation nonvolatile memory device.

Particularly, a three-dimensional cross point array structure has been intensively studied in recent times for increasing the integration degree of the nonvolatile memory devices. In the cross point array structure, a plurality of upper electrodes and a plurality of lower electrodes cross each other and a plurality of memory cells is arranged at every cross point of the upper and lower electrodes. Thus, random access can be possible to each of the memory cells of the cross point array structure, and the data programming to each memory cell and the data reading from each memory cell can be individually conducted with high operating efficiency.

A unit cell is provided at a cross point of the upper and lower electrodes and a plurality of the unit cells is vertically stacked, thereby forming the three-dimensional cross point array structure of the next generation nonvolatile memory devices. The three-dimensional cross point array structure can significantly increase the integration degree of the next generation nonvolatile memory device.

SUMMARY

Example embodiments provide a semiconductor memory device having a cross point array structure in which thermal cross talk is reduced between neighboring cells, thereby increasing the reliability and stability thereof are described herein.

Example embodiments of the above described semiconductor device described herein also include a method of manufacturing the same.

According to exemplary embodiments, there is provided a semiconductor memory device including a plurality of first conductive metal lines that may extend in a first direction and may have a plurality of protrusions and recesses, a plurality of second conductive metal lines that may be disposed over the first conductive metal lines in the second direction, a plurality of memory cells that may be disposed on the plurality of protrusions of the first conductive metal line and extend to the second conductive metal lines in a third direction, and a plurality of thermal insulating plugs that may be disposed in the recesses of the first conductive metal lines. The protrusions and the recesses may be arranged alternately in the first direction and the first and the second conductive metal lines may cross at the protrusions.

According to exemplary embodiments, there is provided another semiconductor memory device including a plurality of first conductive lines extending in a first direction on a substrate and having a plurality of first protrusions and first recesses thereon in such a configuration that the first protrusions and the first recesses may be alternately arranged in the first direction and the first conductive lines may be spaced apart in a second direction and stacked over in a third direction, a plurality of second conductive lines extending in the second direction and having a plurality of second protrusions and second recesses thereon in such a configuration that the second protrusions and the second recesses may be alternately arranged in the second direction and the second conductive lines may be spaced apart in the first direction and stacked over in the third direction. The first and the second conductive lines may be alternately arranged in the third direction and cross each other at the first and the second protrusions. The semiconductor memory device may include a plurality of cell structures may be positioned on the first and the second protrusions such that the cell structures may be stacked over between the first and the second conductive lines in the third direction and a node separation pattern having a first thermal insulating plug and a second thermal insulating plug. The first thermal insulating plug may be positioned in the first recesses of the first conductive line and may reduce heat transfer between a pair of the neighboring cell structures in the first direction. The second thermal insulating plug may be positioned in the second recesses of the second conductive line and may reduce heat transfer between a pair of the neighboring cell structures in the second direction.

According to exemplary embodiments, there is provided another method of manufacturing the above semiconductor memory device. At first, a base structure may be formed on a substrate in such a way that the base structure may include a plurality of a lower first conductive lines extending in a first direction and having a first cell line thereon, a lower first base separation line between a pair of the lower first conductive lines adjacent to each other and extending in the first direction to separate the neighboring lower first conductive lines along a second direction and a first cell separation line on the lower first line separation line between a pair of the first cell lines adjacent to each other to separate the neighboring first cell lines along the second direction. Then, a plurality of second conductive lines may be formed on the base structure in such a way that the second conductive lines may extend in the second direction and may be spaced apart by the same gap distance in the first direction. The second conductive line may alternately make contact with the first cell line and the first cell separation line and a second line trench may be provided between a pair of the second conductive lines adjacent to each other. A first node separation hole may be formed through the first cell line exposed in the second line trench, thus the lower first conductive line may be partially exposed through the first node separation hole. Then, the lower first conductive line that is exposed through the first node separation hole, may be partially removed from the substrate, thereby forming a first recess on the lower first conductive line. A first node separation pattern may be formed in the first recess and the first node separation hole, and a second base separation line may be formed in the second line trench in such a way that the first node separation pattern may be covered and the second conductive lines may be separated by the second base separation line.

According to example embodiments, an alternate series of the recess and protrusion may be formed on the conductive lines and the cell structures may be arranged on the protrusions while the thermal insulating plugs may be arranged in the recesses. Since the bottom of the recess is lower than a top surface of the protrusion at each of the conductive lines 1200 and 1500, the thermal insulating plugs interposed between the neighboring cell structures along each conductive line will be lower than the bottom of the cell structures.

Thus, the heat transfer path between the neighboring cell structures may increase as much as twice the depth of the recess, to thereby reduce the thermal cross talk between the cell structures on the same conductive line.

BRIEF DESCRIPTION OF THE DRAWINGS

These and other features of the herein described subject matter will become more apparent by describing in detail exemplary embodiments thereof with reference to the accompanying drawings of which.

Figure 1:
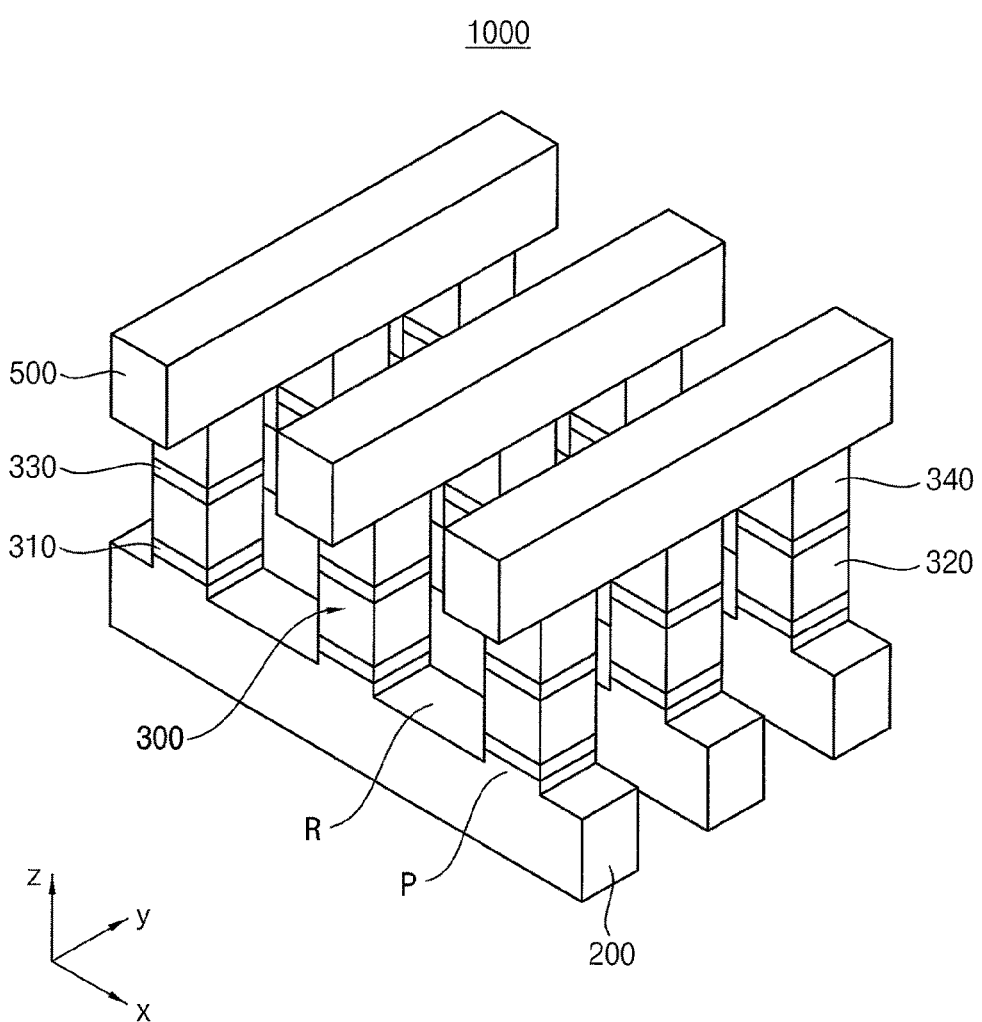
FIG. 1 is a perspective view illustrating a semiconductor memory device in accordance with an example embodiment.
Figure 2:
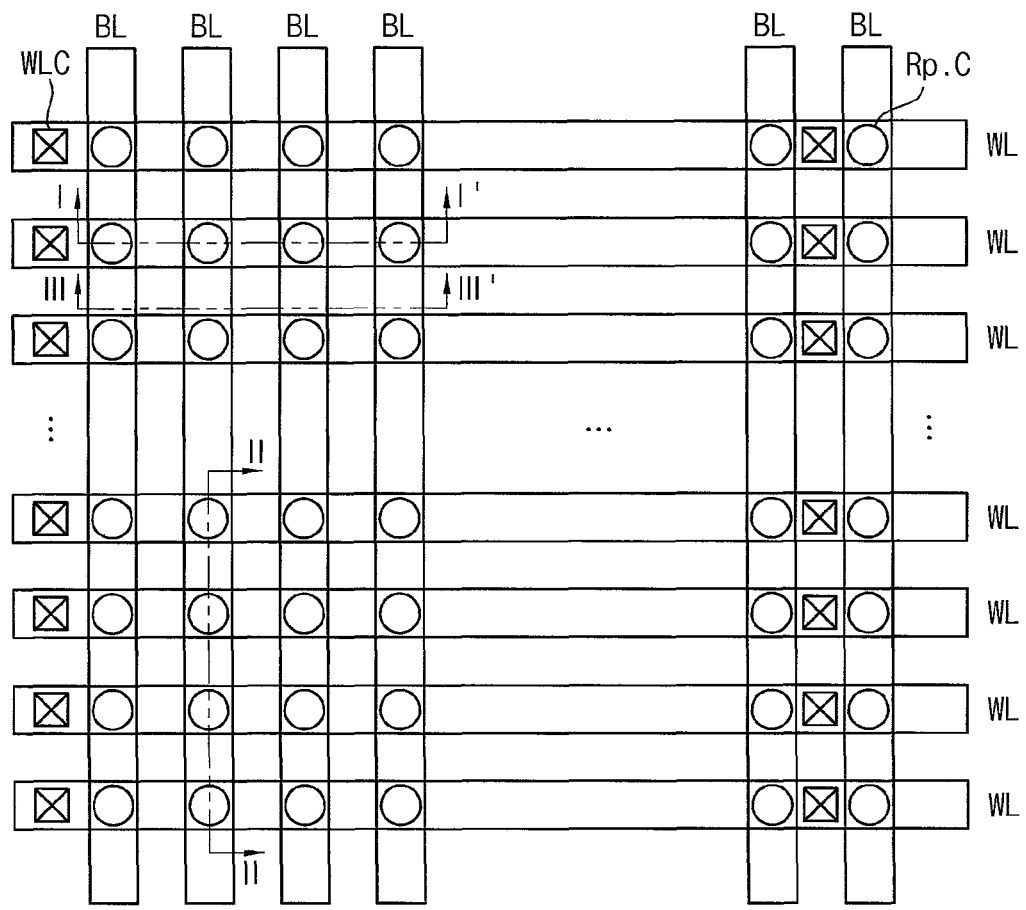
FIG. 2 is a layout illustrating the semiconductor memory device in FIG. 1.
Figure 6:
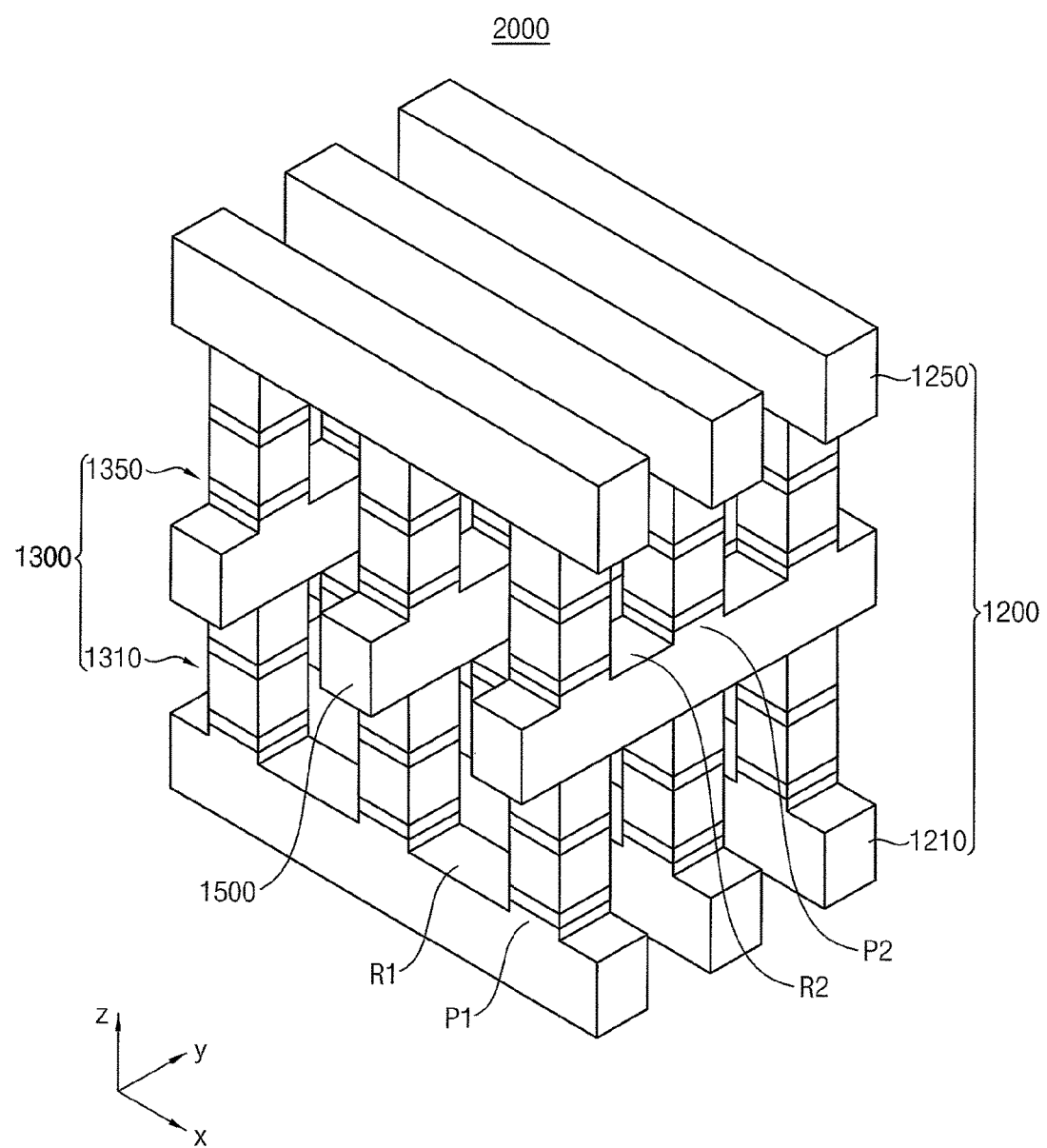
Figure 7A:
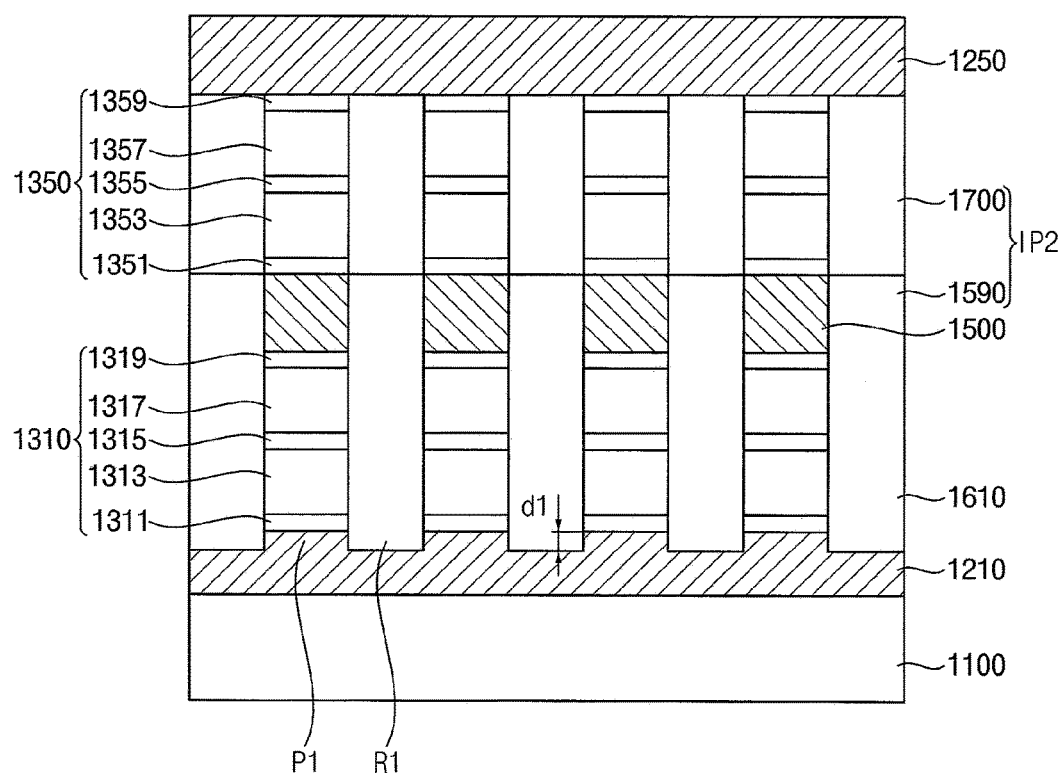
Figure 7B:
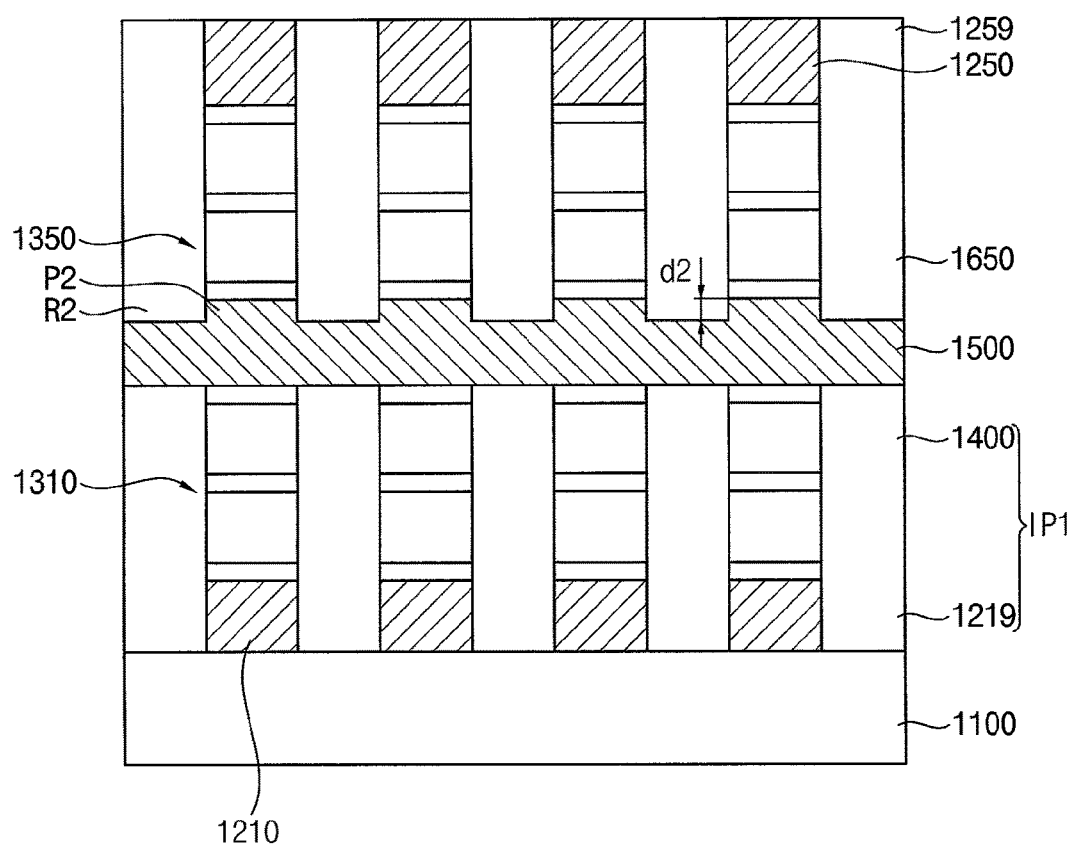
Figure 7C:
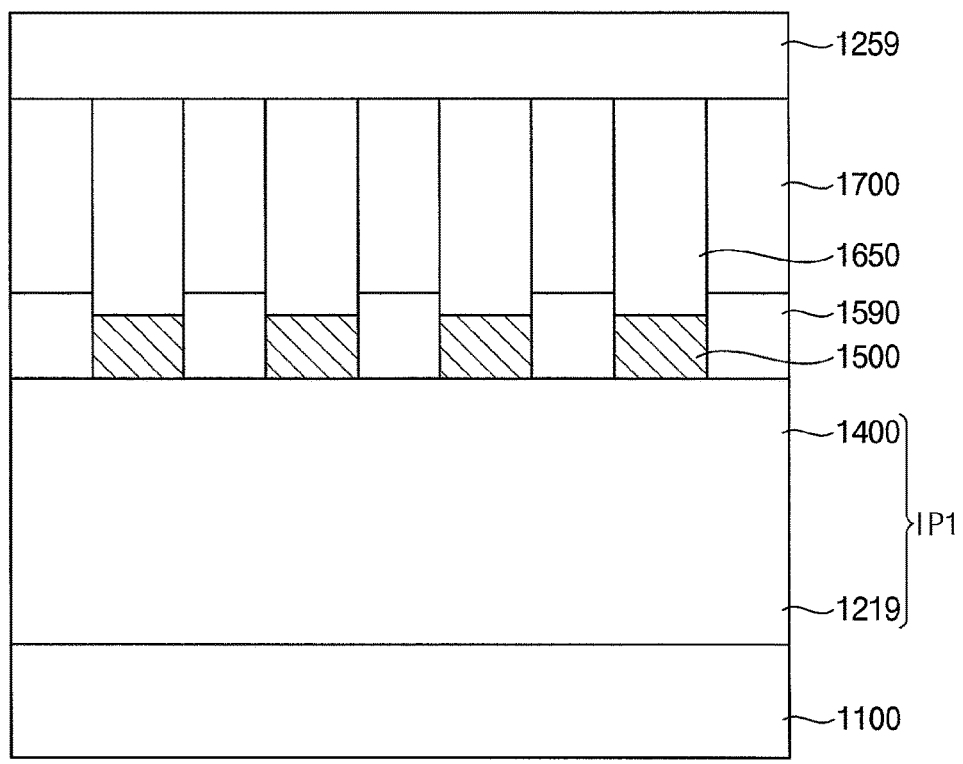
Figure 7D:
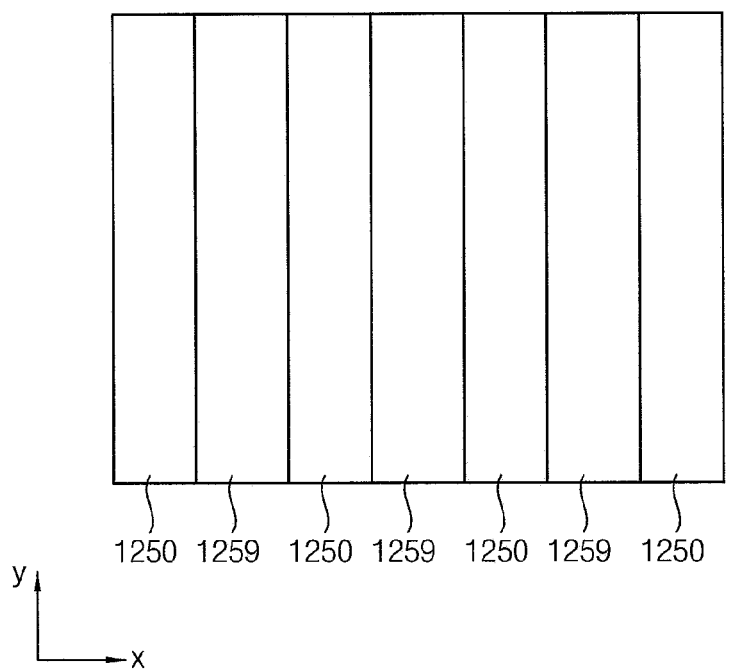

5B is a view illustrating a thermal transfer path of the semiconductor memory device shown in FIG. 1;

FIG. 6 is a perspective view illustrating a semiconductor memory device in accordance with another example embodiment;

FIG. 7A to 7C are cross-sectional views of the semiconductor memory device shown in FIG. 6 and along a line I-I', a line II-II' and a line III-III' of the layout in FIG. 2, respectively;

FIG. 7D is a plan view illustrating the semiconductor memory device in FIG. 6; and FIGS. 8A to 23B are views illustrating process steps for a method of manufacturing the semiconductor memory device in accordance with example embodiments.

DETAILED DESCRIPTION OF THE EMBODIMENTS

The present disclosure now will be described more fully hereinafter with reference to the accompanying drawings, in which various exemplary implementations are shown. The invention may, however, be embodied in many different forms and should not be construed as limited to the example embodiments. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary implementations, these figures are not necessarily intended to be mutually exclusive from each other. Rather, as will be seen from the context of the detailed description below, certain features depicted and described in different figures can be combined with other features from other figures to result in various exemplary embodiments, when taking the figures and their description as a whole into consideration.

Although the figures described herein may be referred to using language such as "one exemplary embodiment," or "certain exemplary embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

The terminology used herein is for the purpose of describing particular exemplary embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Exemplary embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Components described as thermally connected or in thermal communication are arranged such that heat will follow a path between the components to allow the heat to transfer from the first component to the second component. Simply because two components are part of the same device or package does not make them thermally connected. In general, components which are heat-conductive and directly connected to other heat-conductive or heat-generating components (or connected to those components through intermediate heat-conductive components or in such close proximity as to permit a substantial transfer of heat) will be described as thermally connected to those components, or in thermal communication with those components. On the contrary, two components isolated by heat-insulative materials therebetween, which materials significantly prevent heat transfer between the two components, or only allow for incidental heat transfer, are not described as thermally connected or in thermal communication with each other. The terms "heat-conductive" or "thermally-conductive" do not apply to a particular material simply because it provides incidental heat conduction, but are intended to refer to materials that are typically known as good heat conductors or known to have utility for transferring heat, or components having similar heat conducting properties as those materials.

Figure 3:
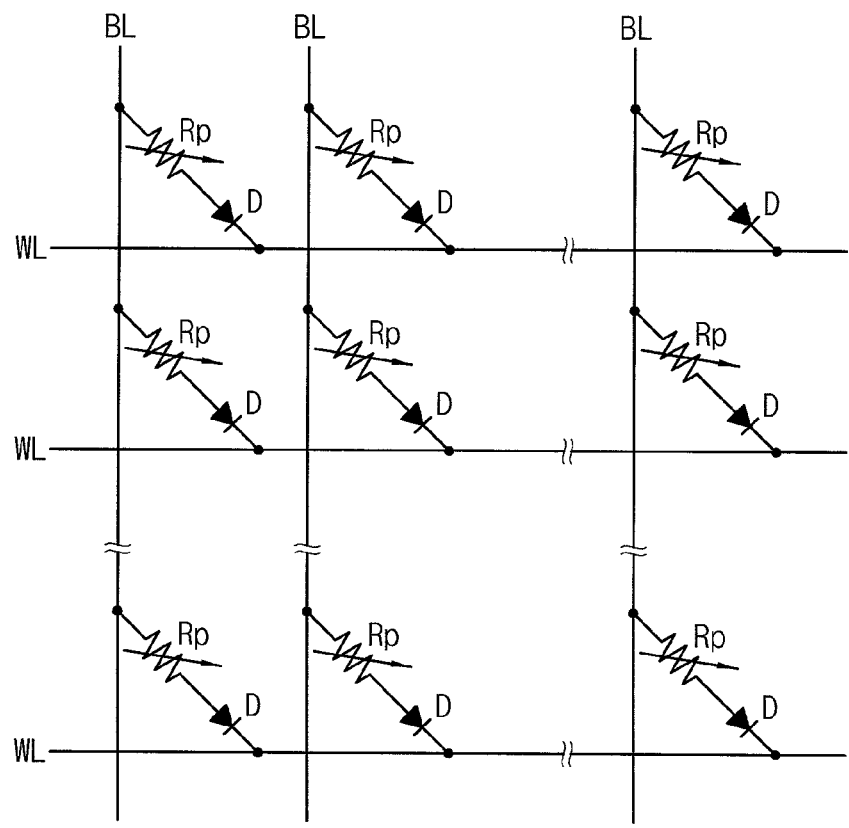
FIG. 3 is an equivalent circuit diagram illustrating a cell array of the semiconductor memory device shown in FIG. 1.
Figure 4A:
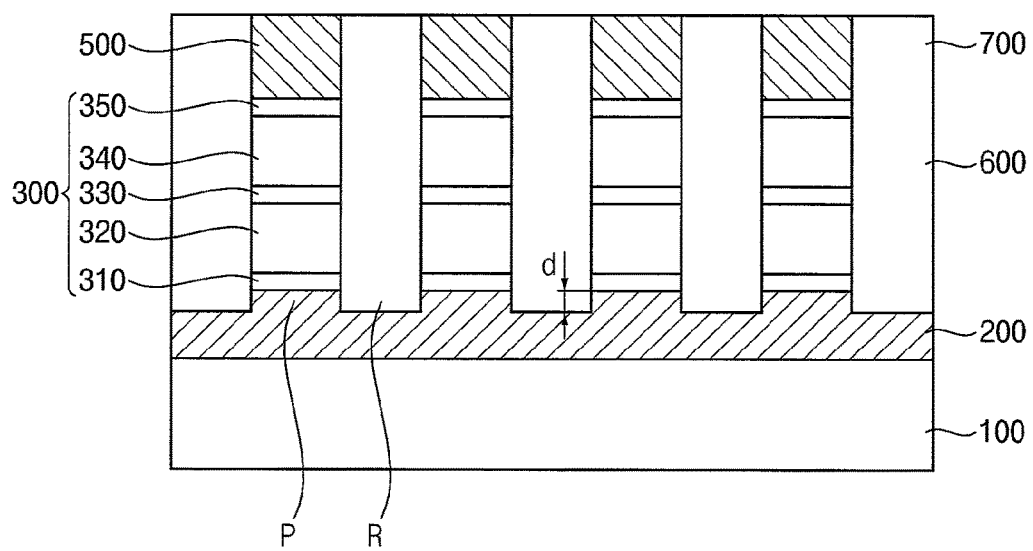
FIGS. 4A to 4C are cross-sectional views of the semiconductor memory device shown in FIG. 1 and along a line I-I', a line II-II' and a line III-III' of the layout in FIG. 2, respectively.
Figure 4B:
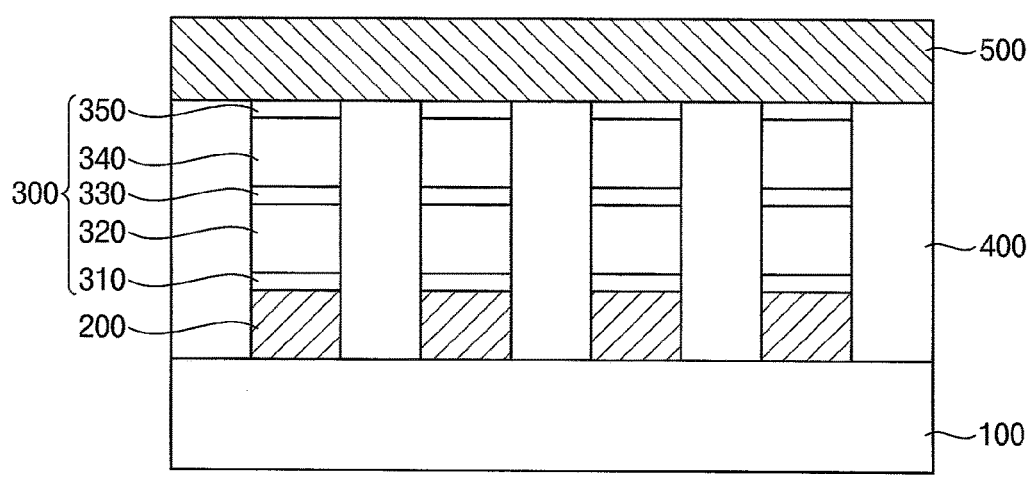
Figure 4C:
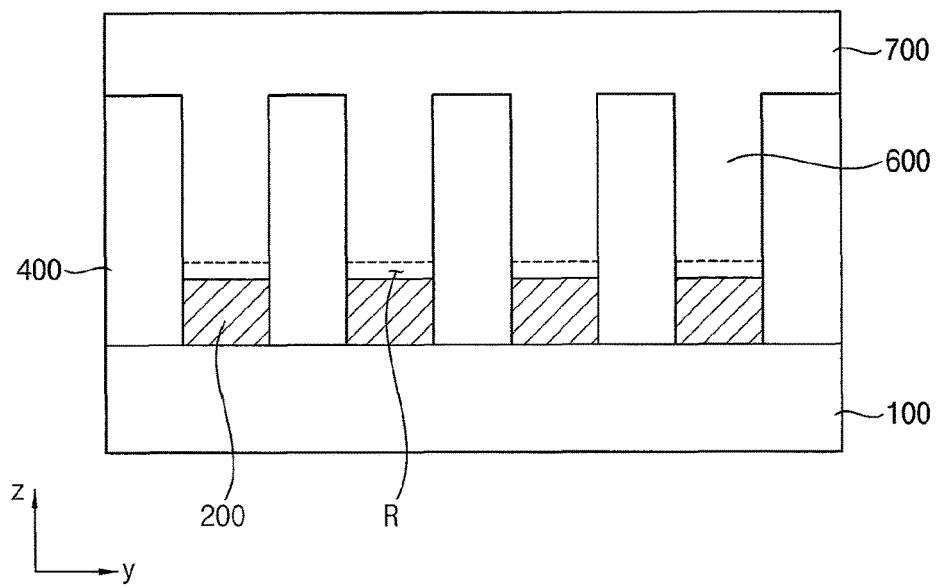
Figure 4D:
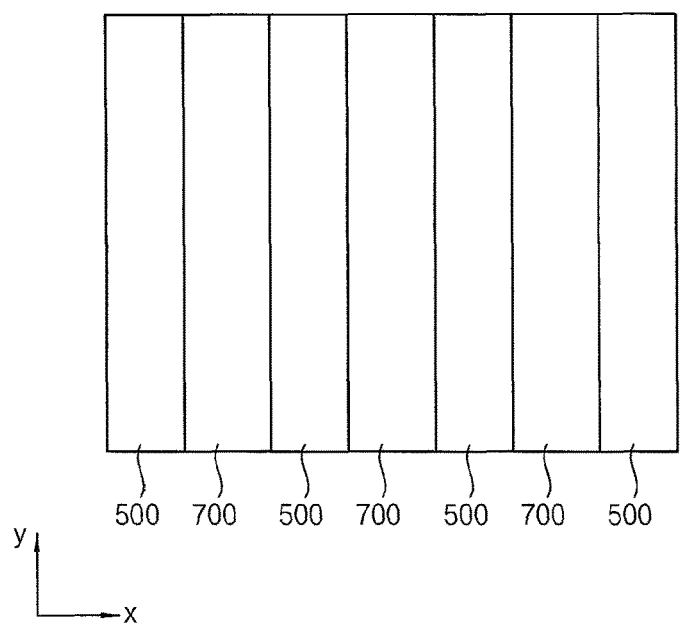
FIG. 4D is a plan view illustrating the semiconductor memory device in FIG. 1.

FIG. 1 is a perspective view illustrating a semiconductor memory device in accordance with an example embodiment, and FIG. 2 is a layout illustrating the semiconductor memory device in FIG. 1. FIG. 3 is an equivalent circuit diagram illustrating a cell array of the semiconductor memory device shown in FIG. 1. FIGS. 4A to 4C are cross-sectional views of the semiconductor memory device shown in FIG. 1 and along a line I-I', a line II-II' and a line III-III' of the layout in FIG. 2, respectively. FIG. 4D is a plan view illustrating the semiconductor memory device in FIG. 1.

As shown in FIGS. 1 to 4D, the semiconductor memory device 1000 may include at least a first conductive line 200 extending in a first direction x, at least a second conductive line 500 extending in a second direction y substantially perpendicular to the first direction x and crossing over the first conductive line and a plurality of cell structures 300 positioned at cross points C of the first and the second conductive lines 200 and 500.

The first conductive line 200 may extend in the first direction x on the substrate 100 and a plurality of protrusions P and recesses R may be alternately arranged on the first conductive line 200. A plurality of the first conductive lines 200 may be spaced apart from each other by the same gap distance in the second direction y. A plurality of the second conductive lines 500 may be arranged over the first conductive lines 200 and may extend in the second direction y having the same gap distance along the first direction x.

The first and the second conductive lines 200 and 500 may cross each other at each protrusion P, so the cross point C of the first and the second conductive lines 200 and 500 may be provided at each of the protrusions P. In such a configuration, the cell structure 300 of the semiconductor memory device 1000 may be provided at every cross point C, thus the semiconductor memory device 1000 may have a cross point cell array structure.

In the present example embodiment, the first and the second conductive lines 200 and 500 may function as a word line or a bit line of the memory device 1000 and may cross each other in a perpendicular direction. If the first conductive line 200 functions as a word line of the memory device 1000, the second conductive line 500 functions as a bit line of the memory device 1000, and vice versa.

More particularly, the word line in the present example embodiment may be connected to a strapping word line (not shown) over the bit line via a word line contact (WLC), thereby reducing electrical resistance of the word line.

The substrate 100 may include a semiconductor substrate such as a silicon (Si) substrate, a gallium (Ga)-arsenic (As) substrate and a silicon (Si)-germanium (Ge) substrate and an insulating substrate such as a silicon-on-insulator (SOI) substrate and a germanium-on-insulator (GOI) substrate in which a pair of silicon/germanium layers may be separated by an insulation layer. The substrate 100 may include any other substrates as long as the substrate may include semiconductor characteristics.

For example, the first conductive line 200 may include a low-resistive metal that may be formed on an insulating buffer layer (not shown) on the substrate 100. Examples of the low-resistive metal may include tungsten (W), titanium (Ti), aluminum (Al), copper (Cu), carbon (C), carbon nitride (CN), titanium nitride (TiN), titanium aluminum nitride (TiAlN), titanium silicon nitride (TiSiN), titanium carbon nitride (TiCN), tungsten nitride (WN), cobalt silicon nitride (CoSiN), tungsten silicon nitride (WSiN), tantalum nitride (TaN), tantalum carbon nitride (TaCN), tantalum silicon nitride (TaSiN), etc. These may be used alone or in combinations thereof.

Otherwise, a semiconductor layer may be formed on the insulating buffer layer by an epitxial growth process and some dopants may be implanted onto the semiconductor layer, to thereby form the first conductive line 200 on the substrate 100.

Some of the first conductive lines 200 may be recessed between the cross points C, thus the protrusions P and the recesses R may be alternately arranged on some of the first conductive lines 200.

The multilayer structure that forms the cell structure 300 may be stacked on the protrusion P in a third direction z and a thermal insulating plug 600 may be positioned on the recess R to thereby electrically and thermally separate the cell structures 300 adjacent to each other in the first direction x. A first insulating pattern 400 may extend between the neighboring first conductive lines in the first direction x and may separate the neighboring first conductive lines 200 and the cell structures 300 that may be adjacent to each other in the second direction y. Thus, the cell structures 300 may be separated from one another along the first and the second directions x and y by the thermal insulation plug 600 and the first insulating pattern 400, thereby functioning as a node-separated memory cell of the semiconductor memory device 1000.

In the present example embodiment, the first insulating pattern 400 may extend to the buffer layer from the top of the cell structure 300 and the cell structure 300 and the first conductive line 200 may be simultaneously separated from each other by the first insulation pattern 400. However, the first insulating pattern 400 may include a base separation line interposed between the neighboring first conductive lines 200 and a cell separation line interposed between the neighboring cell structures 300.

The second conductive line 500 may make contact with a plurality of the cell structures 300 in the second direction y. For example, the first insulating pattern 400 may have an upper surface that may be coplanar with an upper surface of the cell structure 300 and the second conductive line 500 may make alternate contact with the cell structures 300 and the first insulating pattern 400.

Thus, the first conductive line 200 may make contact with a plurality of the cell structures 300 in the first direction x and the second conductive line 500 may make contact with a plurality of the cell structures 300 in the second direction y. In the present example embodiment, the second conductive line 500 may include the same low-resistive metal as the first conductive line 200. However, the second conductive line 500 may also include a dopant semiconductor layer into which some dopants may be implanted according to the characteristics of the semiconductor memory device 1000.

A second insulating pattern 700 may be arranged between the neighboring second conductive lines 500 and may be shaped into a line extending in the second direction y. Thus, the second conductive lines 500 adjacent to each other in the second direction y may be separated by the second insulating pattern 700. The second insulating pattern 700 may make contact with an upper surface of the first insulating pattern 400.

For example, the thermal insulating plug 600 may have an upper surface that may be coplanar with an upper surface of the first insulating pattern 400, so the second insulating pattern 700 may alternately contact with the thermal insulating plug 600 and the first insulating pattern 400. Particularly, the second insulating pattern 700 and the thermal insulating plug 600 may be integrally formed as one homogenous body.

In such a case, the thermal insulating plug 600 may comprise the same insulating materials as the first and the second insulating patterns 400 and 700, so the cell structures 300 interposed between the first and the second conductive lines 200 and 500 may be node-separated from one another by the same insulation materials in the first and the second directions x and y. For example, the insulating material around the cell structure 300 may include one of silicon oxide, silicon nitride and silicon oxynitride.

The cell structure 300 may include a multilayer structure that may be stacked on the cross point C of a word line and a bit line of the memory device 1000.

The cell structure 300 may include at least a variable resistor Rp. The electrical resistance or crystal state of the variable resistor Rp may be reversibly changed in response to an applied signal such as an electrical signal of a voltage or a current, an optical signal and an electromagnetic wave. The reversible change of the variable resistor Rp may be used as bit information of a unit cell of the memory device 1000.

For example, the semiconductor memory device 1000 may include a next generation non-volatile memory device such as a phase changeable random access memory (PRAM) device, a resistive random access memory (RRAM) device and a magnetic random access memory (MRAM) device.

In the present example embodiment, the cell structure 300 include the unit cell of the PRAM device and may have a stacked structure of a heater 310, a data storage element 320, a separation electrode 330 and a selection element 340. The heater 310 may be arranged on the protrusion P of the first conductive line 200 and the data storage element 320 may store a bit data as a material phase that may be changed by a heat from the heater 310. The phase of the data storage element 320 may be controlled by the selection element 340 and the separation electrode 330 may be interposed between the data storage element 320 and the selection element 340 and may prevent material diffusion between the data storage element 320 and the selection element 340. For example, the separation electrode may include a barrier metal layer.

Examples of the material for the heater 310 may include tungsten (W), titanium (Ti), aluminum (Al), copper (Cu), carbon (C), carbon nitride (CN), titanium nitride (TiN), titanium aluminum nitride (TiAlN), titanium silicon nitride (TiSiN), titanium carbon nitride (TiCN), tungsten nitride (WN), cobalt silicon nitride (CoSiN), tungsten silicon nitride (WSiN), tantalum nitride (TaN), tantalum carbon nitride (TaCN), tantalum silicon nitride (TaSiN), etc. These may be used alone or in combinations thereof. The heater may generate Joule's heat in response to an electrical current that may be applied to the cell structure 300 and the material state of the data storage element 320 may be changed by the Joule's heat.

The data storing element 320 may include a phase changeable material such as chalcogenide and a super lattice. Examples of the chalcogenide may include Ge—Sb—Te, Ge—Te—As, Sn—Te—Sn, Ge—Te, Sb—Te, Se—Te—Sn, Ge—Te—Se, Sb—Se—Bi, Ge—Bi—Te, Ge—Te—Ti, In—Se, Ga—Te—Se, In—Sb—Te, Bi—Sb—Te, etc. These may be used alone or in combinations thereof. The super lattice may include an alloy in which Ge—Te and Sb—Te may be alternately stacked on the heater 310.

The selection element 340 may control the electrical current passing to the data storage element 320 according to a voltage of the word line WL. For example, the selection element 340 may include one of a vertical PN junction diode, a shottky diode and an ovonic threshold switch (OTS). Otherwise, the selection element 340 may also include a selection transistor.

Examples of the materials for the OTS may include arsenic (As), germanium (Ge), selenium (Se), tellurium (Te), silicon (Si), bismuth (Bi), sodium (S), antimony (Sb), etc. These may be used alone or in combinations thereof. In the present example embodiment, the OTS may comprise a 6-element material selenium (Se) and sodium (S) may be combined with a compound of germanium (Ge), silicon (Si), arsenic (As) and tellurium (Te).

The separation electrode 330 may be interposed between the data storage element 320 and the selection element 340 and may reduce the contact resistance at a boundary area between the data storage element 320 and the selection element 340. For example, the separation electrode 330 may include a silicide of the metal for the OTS of the selection element 340 or for the phase changeable material of the data storage element 320.

A contact electrode 350 may be further provided between the selection element 340 and the second conductive line 500. The contact electrode 350 may function as a contact plug for connecting the second conductive line 500 and the selection element 340 with each other. For example, the contact electrode 350 may comprise a low-resistive metal or a metal silicide having a low specific resistance.

The cell structure 300 may be arranged on the protrusion P of the first conductive line 200 and the neighboring cell structures in the first direction x may be separated from each other by the thermal insulating plug 600 in the recess R of the first conductive line 200.

For example, the recess R may have a depth d from an upper surface of first conductive line 200, so the upper surface of the protrusion P may be higher than a bottom of the recess R as much as the depth d of the recess R. Since the cell structure 300 may be positioned on the protrusion P and the thermal insulating plug 600 may be positioned in the recess R, the bottom portion of the thermal insulating plug 600 may be lower than the bottom portion of the cell structure 300 by as much as the depth d of the recess R. The thermal insulating plug 600 may prevent thermal and electrical transfer between the neighboring cell structures 300 in the first direction x.

Therefore, when a signal may be applied to one of the cell structures 300 and the cell structure 300 (selection cell) may be accessed and thus heat may be generated from the heater 310 of the selection cell, heat transfer between the selection cell and the cell structure 300 adjacent to the selection cell (adjacent cell) may be sufficiently prevented by the thermal insulating plug 600. Thus, the heat from the selection cell may be transferred to the adjacent cell just via the first conductive line 200, and as a result, the heat transfer path between the selection cell and the adjacent cell may increase as long as the depth of the recess R. Accordingly, the thermal cross talk between the selection cell and the adjacent cell may be reduced due to the recess R of the first conductive line 200.

Figure 5A:
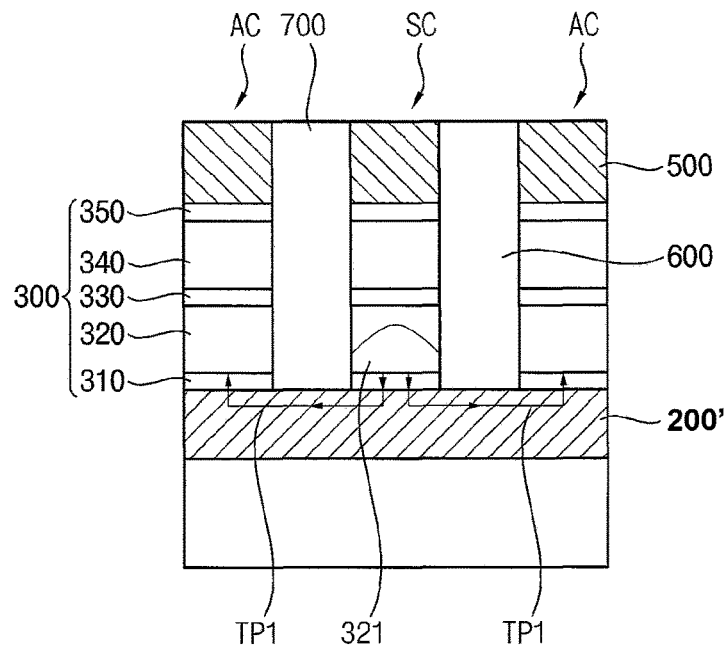
FIG. 5A is a view illustrating a thermal transfer path of a conventional semiconductor memory device having a cross point cell array structure.
Figure 5B:
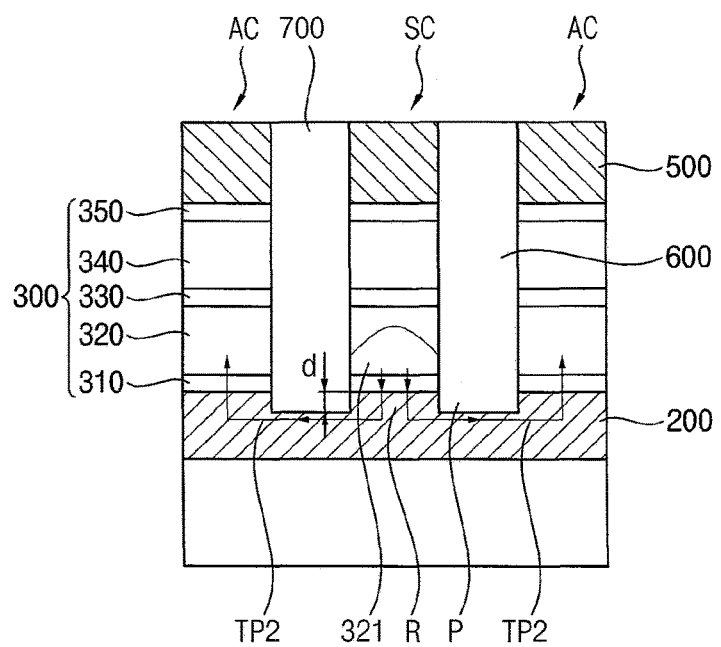

FIG. 5A shows a thermal transfer path of a conventional semiconductor memory device having a cross point cell array structure, and FIG. 5B shows a thermal transfer path of the semiconductor memory device shown in FIG. 1.

As shown in FIG. 5A, when the data storage element 320 of the selection cell SC may be heated by the heater 310, the heat may be radiated from a high temperature area 321 of the heater 310 and the data storage element 320 to the adjacent cell AC via the first conductive line 200'. In such a case, the heat may be transferred from the selection cell SC to the adjacent cell AC through a conventional transfer path TP1 along a surface portion of the first conductive line 200' in the conventional semiconductor memory device.

In contrast, as shown in FIG. 5B, the heat may be transferred from the selection cell SC to the adjacent cell AC through a transfer path TP2 along a surface portion of the recess R of the first conductive line 200 in the semiconductor memory device 1000. Thus, the transfer path TP2 may be longer than the conventional transfer path TP1 twice as long as the depth d of the recess R.

Accordingly, the heat transfer to the adjacent cell AC may be reduced when the selection cell SC may be accessed and thus the thermal cross talk between the selection cell SC and the adjacent cell AC may be reduced due to the longer thermal transfer path, thereby increasing the reliability of the semiconductor memory device having the cross point cell array structure. Particularly, the reduction of the thermal cross talk may significantly improve the operation reliability of semiconductor memory device having high integration degree and a low cell pitch.

FIG. 6 is a perspective view illustrating a semiconductor memory device in accordance with another example embodiment. FIG. 7A to 7C are cross-sectional views cut the semiconductor memory device shown in FIG. 6 along a line I-I', a line II-II' and a line III-III' of the layout in FIG. 2, respectively. FIG. 7D is a plan view illustrating the semiconductor memory device in FIG. 6.

The semiconductor memory device 2000 in FIG. 6 has the same structure as the semiconductor memory device 1000 except for the 3-dimensional cross point cell array structure. Thus, a plurality of the first and the second conductive lines may extend in the first and the second directions x and y and the cell structures may be arranged between the first and the second conductive lines in a multi-stack structures in the third direction z.

As shown in FIGS. 6 to 7D, the semiconductor memory device 2000 in accordance with another example embodiment may include a plurality of first conductive lines 1200 extending in a first direction x on a substrate 1100 and having a plurality of first protrusions P1 and first recesses R1 thereon in such a configuration that the first protrusions P1 and the first recesses R1 may be alternately arranged in the first direction x and the first conductive lines 1200 may be spaced apart in a second direction y and be stacked over in a third direction z, a plurality of second conductive lines 1500 extending in the second direction y and having a plurality of second protrusions P2 and second recesses R2 thereon in such a configuration that the second protrusions P2 and the second recesses R2 may be alternately arranged in the second direction y and the second conductive lines 1500 may be spaced apart in the first direction x and be stacked over in the third direction z, a plurality of cell structures 1300 positioned on the first and the second protrusions P1 and P2 in such a configuration that the cell structures 1300 may be stacked over and between the first and the second conductive lines 1200 and 1500 in the third direction z. A node separation pattern 1600 includes a plurality of first thermal insulating plugs 1610 and a plurality of second thermal insulating plugs 1650. The first thermal insulating plugs 1610 may be positioned in the first recesses R1 of the first conductive line 1200, respectively, and may reduce heat transfer between a pair of first neighboring cell structures 1310 in the first direction x and the second thermal insulating plugs 1650 may be positioned in the second recesses R2 of the second conductive line 1500, respectively, and may reduce heat transfer between a pair of second neighboring cell structures 1350 in the second direction y. The first and the second conductive lines may be alternately arranged in the third direction z and may cross each other at the first and the second protrusions P1 and P2.

In FIG. 6, additional conductive lines extending in the first direction x may be further provided on the semiconductor memory device 1000 shown in FIG. 1, so that the conductive lines may be stacked over into three floors and the cell structures may be arranged between the stacked conductive lines into two floors. That is, the semiconductor memory device 2000 may include three-floor conductive lines and two-floor cell structures. However, the semiconductor memory device 2000 could include four or more floor conductive lines and three or more cell structures in accordance with device requirements and needs.

The first conductive lines 1200 may include a plurality of lower first conductive lines 1210 that may extend in the first direction x on an insulating buffer layer (not shown) of the substrate 1100 and may be spaced apart by the same gap distance in the second direction y and a plurality of upper first conductive lines 1250 that may extend in the first direction x over the lower first conductive lines 1210 and may be spaced apart by the same gap distance in the second direction y.

The lower and the upper first conductive lines 1210 and 1250 may be in parallel with each other along the third direction z or may be shifted from each other along the second direction y.

The substrate 1100 covered by the insulating buffer layer and the first conductive line 1200 may substantially have the same structures as the substrate 100 and the first conductive line 200.

Particularly, the first protrusions P1 and the first recesses R1 may be alternately arranged on each of the first conductive lines 1200 in the first direction x. The first recess R1 may have a first depth d1 from an upper surface of the first conductive line 1200, so that the upper surface of the first protrusion P1 may be higher than the bottom of the first recess R1 as much as the first depth d1.

The first cell structure 1310 may be positioned on the first protrusion P1 and the first thermal insulating plug 1610 may be positioned in the first recess R1, thus the first thermal insulating plugs 1610 and the first cell structures 1310 may be alternately arranged on the first conducive line 1200, and as a result the first cell structures 1310 on the first conductive line 1200 may be separated from each other in the first direction x by the first thermal insulting plug 1610.

A plurality of (lower and upper) first base separation lines 1219 and 1259 may extend in the first direction x and be interposed between the neighboring first conductive lines 1200, so that the neighboring first conductive lines 1200 may be separated from each other by the first base separation line 1219 or 1259. A first cell separation line 1400 may be arranged on each of the first separation lines 1219 and 1259, and first cell structures 1310 on the neighboring first conductive lines 1300 may be separated by the first cell separation line 1400 along the second direction y.

The first cell structure 1310 may be interposed between the lower first conductive lines 1210 and the second conductive lines 1500 and may be contact with the first protrusion P1 of the lower first conductive line 1210 and with a lower surface of the second conductive line 1500. The first cell structure 1310 may be node-separated from one another by the first thermal insulating plug 1610 and the first cell separation line 1400, and may be positioned on every first protrusion P1.

The second conductive line 1500 may extend in the second direction y and may alternately contact with the first cell structure 1310 and the first cell separation line 1400. The first cell structure 1310 may be positioned at every cross point of the first and the second conductive lines 1200 and 1500, thereby forming a first floor cross point cell array structure for the semiconductor memory device 2000.

A second base separation line 1590 may extend in the second direction y between the neighboring second conductive lines 1500, so that the second conductive lines 1500 may be separated from each other along the first direction x by the second base separation line 1590.

The second base separation line 1590 may cross the first cell separation line 1400 and an upper surface of the second base separation line 1590 may be coplanar with an upper surface of the second protrusion P2 of the second conductive line 1500. When the first thermal insulating plug 1610 may be coplanar with the first cell separation line 1400, the second base separation line 1590 may alternately contact with the first cell separation line 1400 and the first thermal insulating plug 1610 in the second direction y.

In the present example embodiment, the first thermal insulating plug 1610 and the second base separation line 1590 may be integrally provided in one body that may be formed in a single process. Particularly, when the lower first base separation line 1219 and the first cell separation line 1400 may comprise the same insulating materials and the first thermal insulating plug 1610 may comprise the same insulating materials as the first cell separation line 1400, the first conductive line 1200 and the first cell structure 1310 may be separated with one another by a single insulating pattern.

The first base separation lines 1219 and 1259, the first cell separation line 1400, the first cell structure 1310 and the first thermal insulating plug 1610 may have the same structures as the first insulating pattern 400, the cell structure 300 and the thermal insulating plug 600, respectively, so any detailed descriptions on the first base separation lines 1219 and 1259, the first cell separation line 1400, the first cell structure 1310 and the first thermal insulating plug 1610 will be omitted.

The second protrusions P2 and the second recesses R2 may be alternately arranged on each of the second conductive lines 1500 in the second direction y. The second recess R2 may have a second depth d2 from an upper surface of the second conductive line 1500, so that the upper surface of the second protrusion P2 may be higher than the bottom of the second recess R2 as much as the second depth d2.

The second cell structure 1350 may be positioned on the second protrusion P2 and the second thermal insulating plug 1650 may be positioned in the second recess R2, thus the second thermal insulating plugs 1650 and the second cell structures 1350 may be alternately arranged on the second conducive line 1500. As a result, the second cell structures 1350 on the second conductive line 1500 may be separated from each other in the second direction y by the second thermal insulting plug 1650.

A plurality of second base separation lines 1590 may extend in the second direction y and may be interposed between the neighboring second conductive lines 1500, so that the neighboring second conductive lines 1500 may be separated from each other by the second base separation line 1590. A second cell separation line 1700 may be arranged on each of the second separation lines 1590, thus the second cell structures 1350 may be separated by the second cell separation line 1700 along the first direction x.

The upper first conductive line 1250 may extend in the first direction x and may be alternately contact with the second cell structure 1350 and the second cell separation line 1700. The second cell structure 1350 may be positioned at every cross point of the second conductive line 1500 and the upper first conductive line 1250, thereby forming a second floor cross point cell array structure for the semiconductor memory device 2000.

The upper base separation line 1259 may extend in the first direction x between the neighboring upper first conductive lines 1250, so that the upper first conductive lines 1250 may be separated from each other along the second direction y by the upper first base separation line 1259.

The upper first base separation line 1259 may cross the second cell separation line 1700 and an upper surface of the upper first base separation line 1259 may be coplanar with an upper surface of the first protrusion (not shown) of the upper first conductive line 1250.

While the present example embodiment discloses that the upper first conductive line 1250 may be provided as an uppermost first conductive line and thus the two-floor cell structure 1300 may be provided as the cross point cell array structure of the semiconductor memory device 2000, three or more floor cell structure may also be provided as the cross point cell array structure for the semiconductor memory device just by further providing additional protrusions and recesses (not shown) on the upper first conducive line 1250 and/or additional second conductive lines (not shown) and further providing additional cell structures on every additional protrusion.

Particularly, when the second thermal insulating plug 1650 may be coplanar with the second cell separation line 1700, the upper first base separation line 1259 may alternately contact with the second cell separation line 1700 and the second thermal insulating plug 1650 in the first direction x.

In the present example embodiment, the second thermal insulating plug 1650 and the upper first base separation line 1259 may be integrally provided in one body that may be formed in a single process. In addition, when the second cell separation line 1700 may comprise the same insulating materials as the second thermal insulating plug 1650, the second cell structure 1350 may be individually separated by a single insulating pattern.

Further, when the second base separation line 1590 and the first cell separation line 1400 may comprise the same insulating materials as the second cell separation line 1700 and the first and the second thermal insulating plugs 1610 and 1650 may comprise the same materials as the first and the second cell separation lines 1400 and 1700, the first and the second cell structures 1310 and the 1350 may be separated with one another by a single insulating pattern.

For example, the base separation lines 1219, 1259 and 1590, the cell separation lines 1400 and 1700 and a node separation pattern having the first and the second thermal insulating plugs 1610 and 1650 may comprise silicon nitride, silicon oxide or silicon oxynitride.

According to the example embodiments of semiconductor memory device 2000, the first and the second thermal insulating plugs 1610 and 1650 may be located at a position lower than the first and the second cell structures 1310 and 1350 as much as the first and the second depths d1 and d2, respectively. Thus, the thermal cross talk between the selection cell and the adjacent cell may be sufficiently prevented, as described in detail with reference to FIGS. 5A and 5B. Therefore, electrical damage to data in adjacent cells caused by heat from the selection cell may be reduced, thereby increasing the reliability of the semiconductor device 2000.

Hereinafter, the method of manufacturing the semiconductor memory device will be described in detail with reference to the company drawings.

FIGS. 8A to 23B are views illustrating process steps for a method of manufacturing the semiconductor memory device in accordance with an example embodiment. While the process steps may be exemplarily disclosed for a method of manufacturing the semiconductor device shown in FIG. 6 in the present example embodiment, any other semiconductor memory devices having three or more floor cell structure may also be manufactured as the same process. In the accompanying figures, the capital letter 'A' denotes a cross-sectional view of the semiconductor memory device shown in FIG. 6 along line I-I' of the layout shown in FIG. 2, and the capital letter 'B' denotes a cross-sectional view of the semiconductor memory device shown in FIG. 6 along line II-II' of the layout shown in FIG. 2. The capital letter 'C' denotes a cross-sectional view of the semiconductor memory device shown in FIG. 6 along line III-III' of the layout shown in FIG. 2.

Figure 8A:
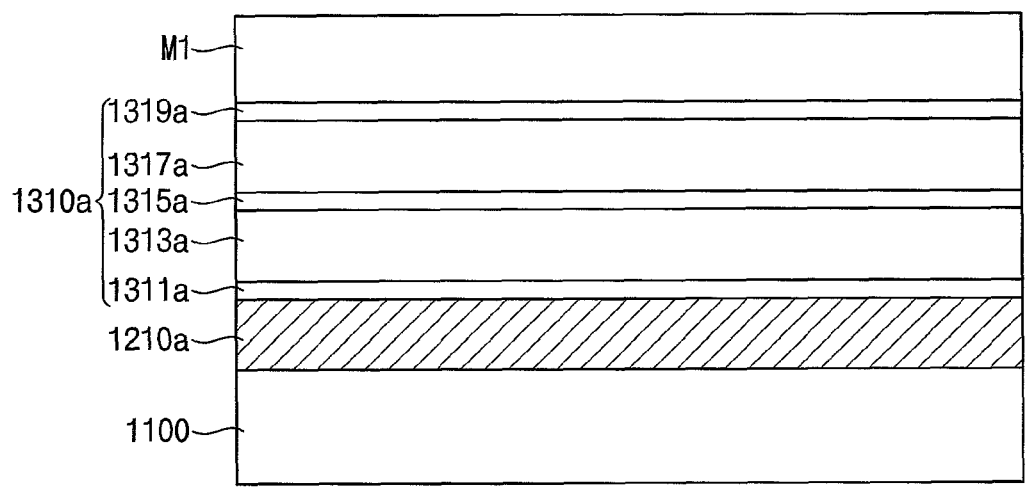
Figure 8B:
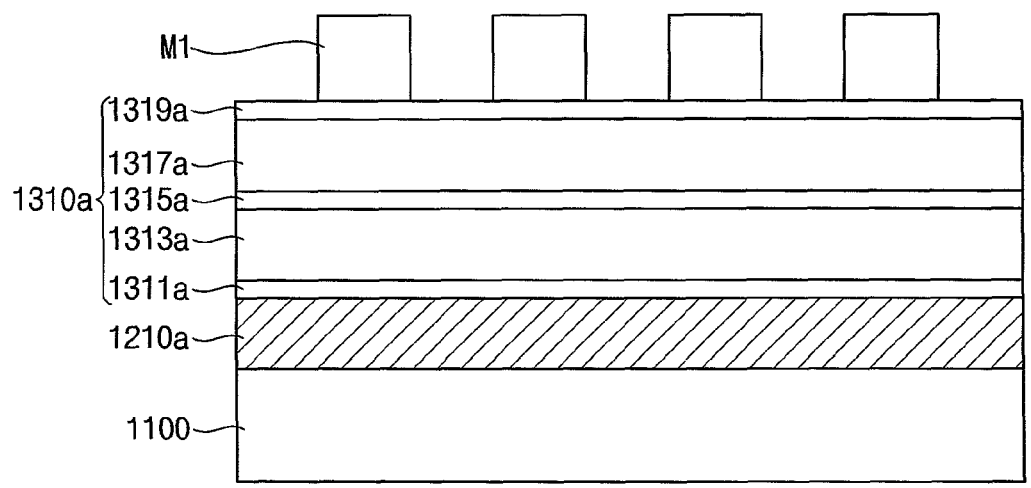

As shown in FIGS. 8A to 8B, a lower first conductive layer 1210a and a first multilayer 1310a for the first cell structures 1310 may be formed on the substrate 1100 and a first mask pattern M1 may be formed on the first multilayer 1310a. The first mask pattern M1 may be formed into a line pattern extending in the first direction x and spaced apart by the same gap distance in the second direction y.

The substrate 1100 may include a semiconductor substrate such as a silicon wafer and an insulating semiconductor substrate such as a silicon-on-insulator (SOI) substrate.

A buffer layer (not shown) may be formed on the substrate 1100 and low resistive metals may be deposited on the buffer layer by a deposition process or may be implanted onto the buffer layer by an ion implantation process. In contrast, an expitaxial layer may be formed on the substrate 1100 and impurities such as low resistive metals may be doped into the epitaxial layer. In the present example embodiment, the low resist metals may be deposited on the buffer layer by a chemical vapor deposition (CVD) process, thereby forming the lower first conductive layer 1210a on the buffer layer on the substrate 1100.

Examples of the low resistive metals may include tungsten (W), titanium (Ti), aluminum (Al), copper (Cu), carbon (C), carbon nitride (CN), titanium nitride (TiN), titanium aluminum nitride (TiAlN), titanium silicon nitride (TiSiN), titanium carbon nitride (TiCN), tungsten nitride (WN), cobalt silicon nitride (CoSiN), tungsten silicon nitride (WSiN), tantalum nitride (TaN), tantalum carbon nitride (TaCN), tantalum silicon nitride (TaSiN), etc. These may be used alone or in combinations thereof.

The first multilayer 1310a may be formed into the first cell structures 1300 in a subsequent process and may include component layers of the first cell structures 1300. That is, the component layers for the first cell structures 1300 may be sequentially stacked on the lower first conductive layer 1210a.

In the present example embodiment, the first cell structure 1300 may include a unit cell of the phase changeable random access memory (PRAM) device in which the cell data may be stored through the phase change of the first cell structure 1300 between crystalline and amorphous structures. Thus, a first electrode layer 1311a, which may be formed into a heater for generating Joule's heat, may be formed on the lower first conductive layer 1210a, and a phase changeable material layer 1313a may be formed on the first electrode layer 1311a. Then, a second electrode layer 1315a, which may be formed into an anti-diffusion layer, may be formed on the phase changeable material layer 1313a, and a switching layer 1317a, which may be formed into a selection element, may be formed on the second electrode layer 1315a. Thereafter, a third electrode layer 1319a may be formed on the switching layer 1317a. The third electrode layer 1319a may be formed into the third electrode 1319 functioning as a contact plug between the first cell structure 1300 and the second conductive line 1500.

Metals that may be non-reactive to the phase changeable material layer 1313a may be deposited onto the lower first conductive layer 1210a by a CVD process, thereby forming the first electrode layer 1311a. The first electrode layer 1311a may be formed into a single layer structure or a multilayer structure. The single layer structure of the first electrode layer 1311a may comprise tungsten (W), titanium (Ti), aluminum (Al), copper (Cu) and carbon (C). The multilayer layer structure of the first electrode layer 1311a may comprise carbon nitride (CN), titanium nitride (TiN), titanium aluminum nitride (TiAlN), titanium silicon nitride (TiSiN), titanium carbon nitride (TiCN), tungsten nitride (WN), cobalt silicon nitride (CoSiN), tungsten silicon nitride (WSiN), tantalum nitride (TaN), tantalum carbon nitride (TaCN), tantalum silicon nitride (TaSiN) and combinations thereof.

The phase changeable material layer 1313a may comprise phase changeable materials of which the phase may be changed between the amorphous phase having a relatively higher specific resistance and the crystalline phase having a relatively lower specific resistance according to heating temperature and time. Examples of the phase changeable materials may include tellurium (Te), selenium (Se), germanium (Ge), antimony (Sb), bismuth (Bi), lead (Pb), tin (Sn), arsenic (As), sodium (S), silicon (Si), phosphorus (P), oxygen (O), etc. These may be used alone or in combinations thereof. For example, the phase changeable material layer 1313a may include a chalcogenide or a doped chalcogenide with impurities. Examples of the chalcogenide may include Ge—Sb—Te, Ge—Te—As, Sn—Te—Sn, Ge—Te, Sb—Te, Se—Te—Sn, Ge—Te—Se, Sb—Se—Bi, Ge—Bi—Te, Ge—Te—Ti, In—Se, Ga—Te—Se, In—Sb—Te, Bi—Sb—Te, etc. These may be used alone or in combinations thereof.

Otherwise, the phase changeable material layer 1313a may be formed into a super lattice structure in which two or more materials may be sequentially stacked over by a molecular beam epitaxial (MBE) process or an atomic layer deposition (ALD) process. The super lattice may need significantly low heat for the phase change, thus the phase change between the amorphous and crystalline phases may be conducted at a relatively low temperature. For example, the phase changeable material layer 1313a may include an alloy in which GeTe and SbTe may be alternately stacked by a unit of molecules or atoms.

The second electrode layer 1315a may be formed on the phase changeable material layer 1313a and may separate the phase changeable material layer 1313a from the switching layer 1317a. The second electrode layer 1315a may prevent the phase changeable material layer 1313a from reacting with the switching layer 1317a and may prevent the switching layer 1317a from diffusing into the phase changeable material layer 1313a in a subsequent process for forming the switching layer 1317a.

For example, the second electrode layer 1315a may include a metal silicide that may be non-reactive with the phase changeable material layer 1313a. The metal silicide for the second electrode layer 1315a may include tungsten silicide, cobalt silicide, nickel silicide, titanium silicide and tantalum silicide.

The switching layer 1317a may be formed into a selection element 1317 for selecting an operation mode of the cell structure 1300 by switching electrical currents on or off. For example, the selection element 1317 may include one of a vertical PN junction diode, a Schottky diode and an ovonic threshold switch (OTS). Thus, the switching layer 1317a may comprise a proper layer structure according to the structure of selection element 1317.

For example, the switching layer 1317a may be formed into a diode layer in which a pair of semiconductor layers having opposite polarity types may be alternately stacked on the second electrode layer 1315a.

Otherwise, the switching layer 1317a may be formed into an amorphous semiconductor layer on the second electrode layer 1315a. The amorphous semiconductor layer may have discontinuous voltage-current characteristics and may include at least one of arsenic (As), germanium (Ge), selenium (Se), tellurium (Te), silicon (Si), bismuth (Bi), sodium (S), antimony (Sb) and in combinations thereof.

In the present example embodiment, the amorphous semiconductor layer comprising arsenic (As), germanium (Ge), tellurium (Te), silicon (Si) may be formed on the second electrode layer 1315a and then selenium (Se) and sodium (S) may be implanted onto the amorphous semiconductor layer by an ion implantation process, thereby forming the switching layer 1317a as a 6-element amorphous semiconductor layer.

The third electrode layer 1319a may be further formed on the switching layer 1317a for a contact plug between the selection element 1317 and the second conductive line 1500. Thus, the third electrode layer 1319a may comprise a low-resistive metal or a metal silicide of the low-resistive metal.

The third electrode layer 1319a may be formed in the formation of the cell structure 1300 or may be formed in a via process before the formation of the second conductive line 1500. In the present example embodiment, the third electrode layer 1319*a* may be formed on the switching layer 1317*a* as a component of the cell structure 1300.

Accordingly, the first electrode layer 1311*a*, the phase changeable material layer 1313*a*, the second electrode layer 1315*a*, the switching layer 1317*a* and the third electrode layer 1319*a* may be sequentially formed on the lower first conductive layer 1210*a*, thereby forming a first multilayer 1310*a* on the lower first conductive layer 1210*a*.

Thereafter, a mask layer (not shown) may be formed on the first multilayer 1310*a* and may be patterned into a first mask pattern M1 by a photolithography process. The first mask pattern M1 may be formed into a plurality of lines extending in the first direction x and spaced apart along the second direction y.

Figure 9A:
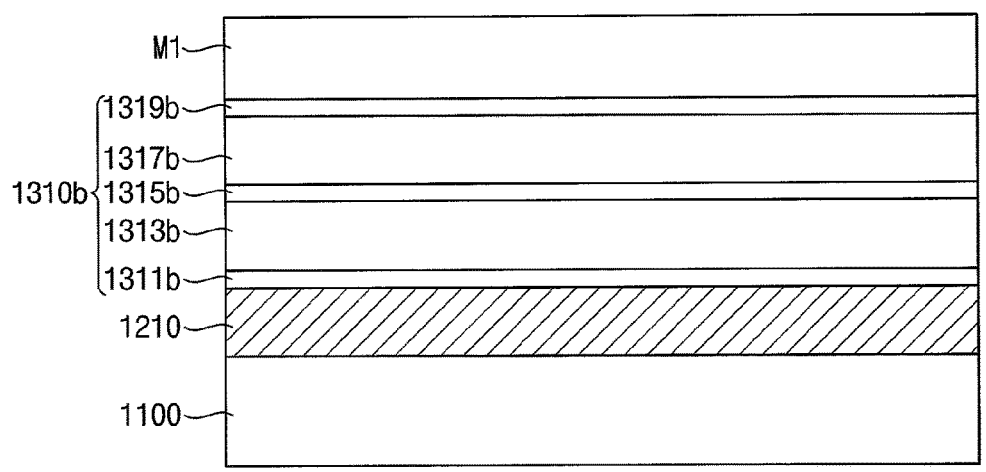
Figure 9B:
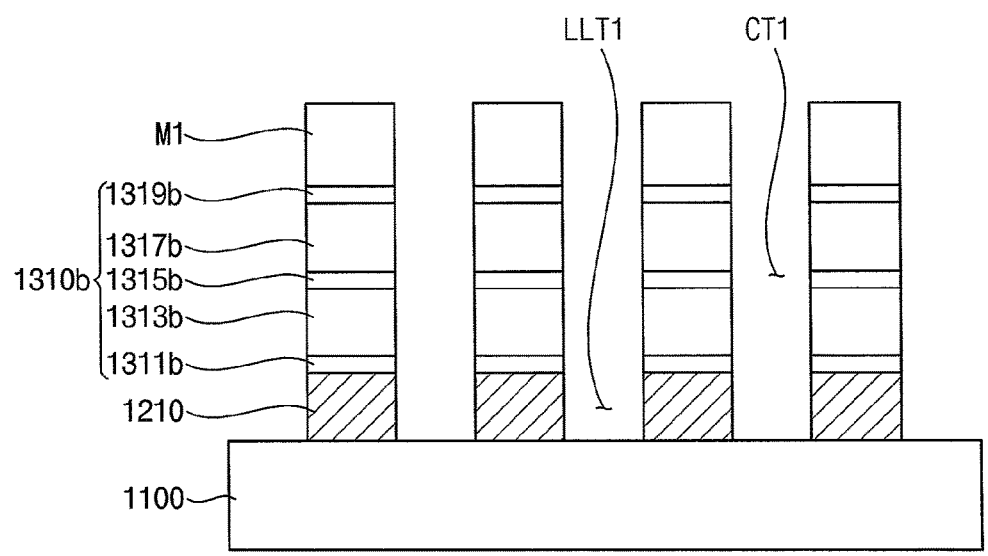

As shown in FIGS. 9A and 9B, the first multilayer 1310*a* and the lower first conductive layer 1210*a* may be partially removed from the substrate 1100 by an etching process using the first mask pattern M1 as an etching mask, thereby forming a lower first line trench LLT1 and a first cell trench CT1 that may extend in the first direction x.

The third electrode layer 1319*a*, the switching layer 1317*a*, the second electrode layer 1315*a*, the phase changeable material layer 1313*a* and the first electrode layer 1311*a* may be sequentially etched off from the substrate 1100 in a shape of line extending in the first direction x, thereby forming the first cell trench CT1, and then the lower first conductive layer 1210*a* may be consecutively etched off from the substrate 1100 to form the lower first line trench LLT1 communicating with the first cell trench in the first direction x.

In the present example embodiment, the etching process may be consecutively performed to the first multilayer 1310*a* and the lower first conductive layer 1210*a*, thus the first cell trench CT1 and the lower line trench LLT1 may be consecutively formed in the same etching process. Accordingly, the first multilayer 1310*a* may be formed into a plurality of first cell lines 1310*b* that may be spaced apart by the first cell trench CT1 and the lower first conductive layer 1210*a* may be formed into a plurality of the lower first conductive lines 1210 that may be spaced apart by the lower first line trench LLT1. The first cell lines 1310*b* may include a first electrode pattern 1311*b*, a phase changeable material pattern 1313*b*, a second electrode pattern 1315*b*, a switching pattern 1317*b* and a third electrode pattern 1319*b*.

Figure 10A:
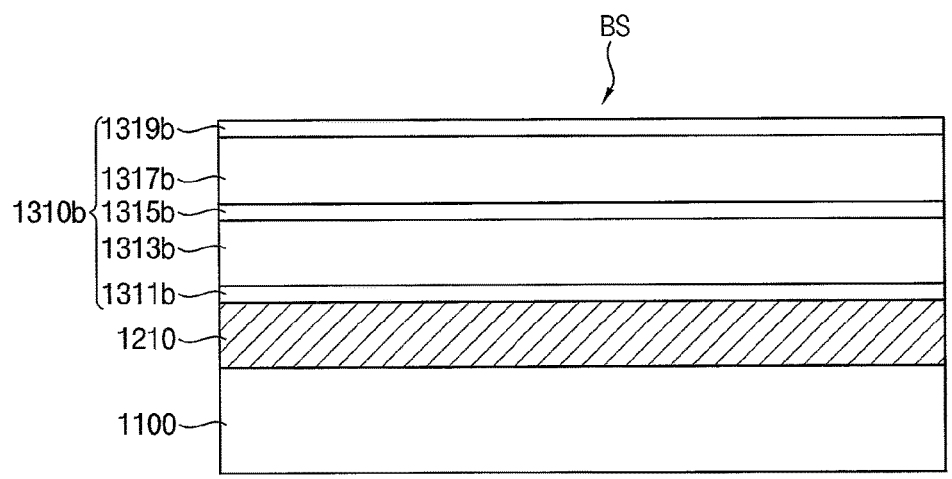
Figure 10B:
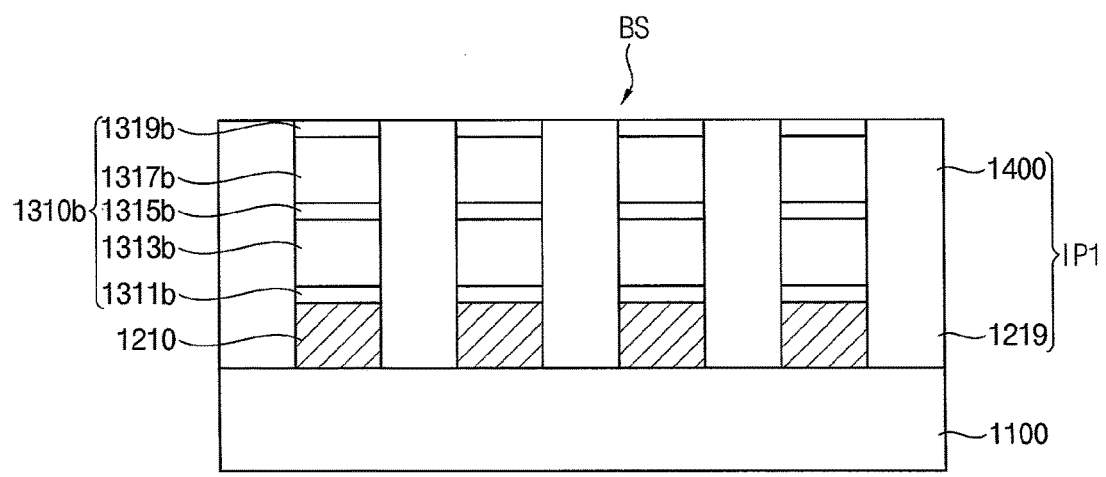

As shown in FIGS. 10A and 10B, the first cell separation line 1400 may be formed in the first cell trench CT1 and the first base separation line 1219 may be formed in the lower first line trench LLT1, thereby separating the neighboring first cell lines 1310*b* and the neighboring lower first conductive lines 1210 along the second direction y. In the present example embodiment, the first cell separation line 1400 and the first base separation line 1219 may be simultaneously formed on the substrate 1100 as a first insulation pattern IP1.

For example, an insulation layer (not shown) may be formed on the substrate 1100 to a sufficient thickness to fill up the first cell trench CT1 and the lower first line trench LLT1, and then may be planarized until an upper surface of the first cell line 1310*b*. Thus, the insulation layer may remain just in the first cell trench CT1 and the lower first line trench LLT1, thereby forming the first cell separation line 1400 and the first base separation line 1219 on the substrate 1100.

Since the first cell separation line 1400 and the first base separation line 1219 may be simultaneously formed with the same insulation materials, the first cell lines 1310*b* and the lower first conductive lines 1210 may be separated from one another by the first insulation pattern IP1. Examples of the insulation pattern IP1 may include silicon oxide, silicon nitride and silicon oxynitride.

The lower first conductive lines 1210 and the first cell lines on each of the lower first conductive lines 1210 that may extend in the first direction x and the first insulation pattern IP1 including the first cell separation line 1400 and the first base separation line 1219 may be formed into a base structure BS on the substrate 1100.

Figure 11A:
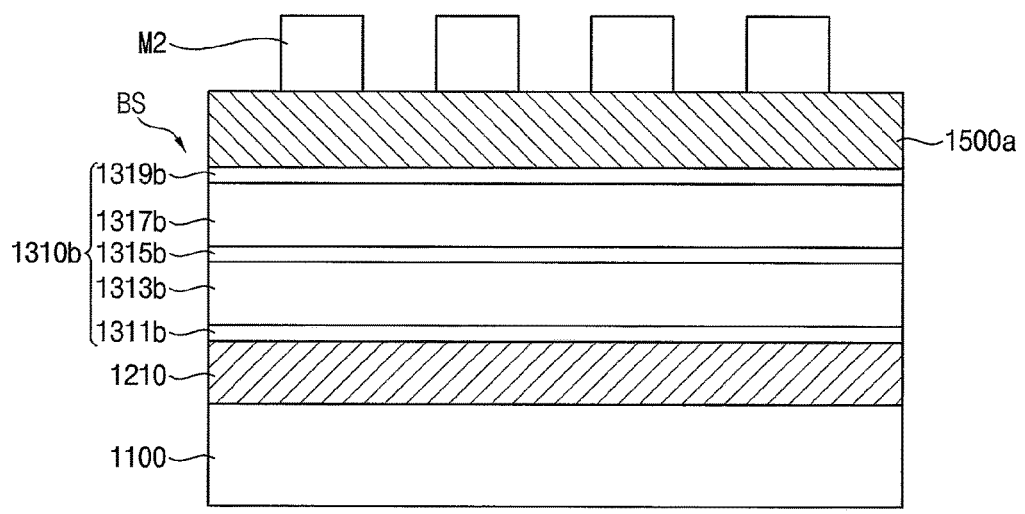
Figure 11B:
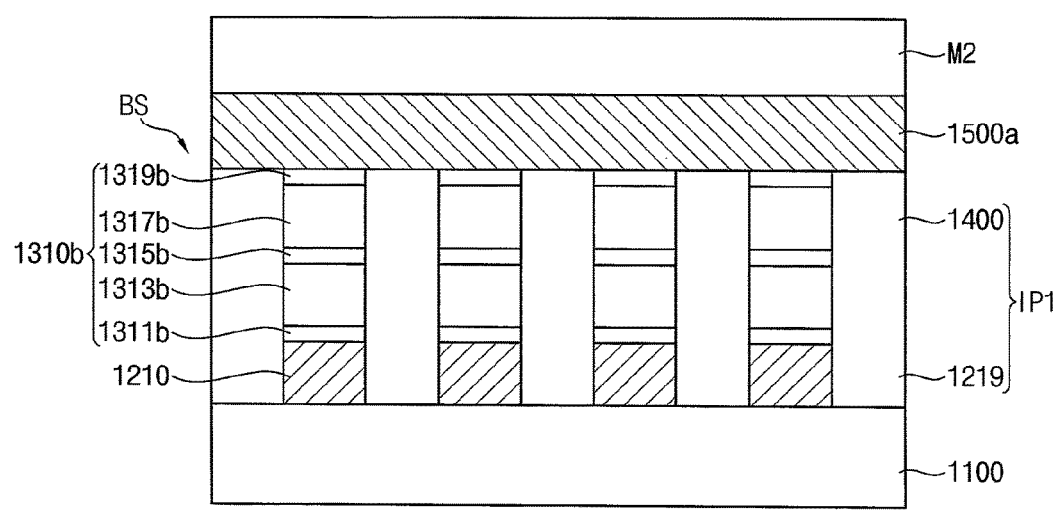

As shown in FIGS. 11A and 11B, a second conductive layer 1500*a* may be formed on the base structure BS in such a way that the base structure BS may be covered with the second conductive layer 1500*a* and a top surface of the second conductive layer 1500*a* may become flat. Then, a second mask pattern M2 may be formed on the second conductive layer 1500*a*.

For example, low-resistive metals may be deposited onto the base structure BS by a deposition process, thereby forming a low-resistive metal layer on the base structure BS as the second conductive layer 1500*a*. Examples of the low-resistive metals for the second conductive layer 1500*a* may include tungsten (W), titanium (Ti), aluminum (Al), copper (Cu), carbon (C), carbon nitride (CN), titanium nitride (TiN), titanium aluminum nitride (TiAlN), titanium silicon nitride (TiSiN), titanium carbon nitride (TiCN), tungsten nitride (WN), cobalt silicon nitride (CoSiN), tungsten silicon nitride (WSiN), tantalum nitride (TaN), tantalum carbon nitride (TaCN), tantalum silicon nitride (TaSiN), etc. These may be used alone or in combinations thereof. Particularly, the second conductive layer 1500*a* may comprise the same materials as the lower first conductive layers 1210*a*.

Then, the second mask pattern M2 may be formed on the second conductive layer 1500*a* into a plurality of lines extending in the second direction y and spaced apart along the first direction x.

Figure 12A:
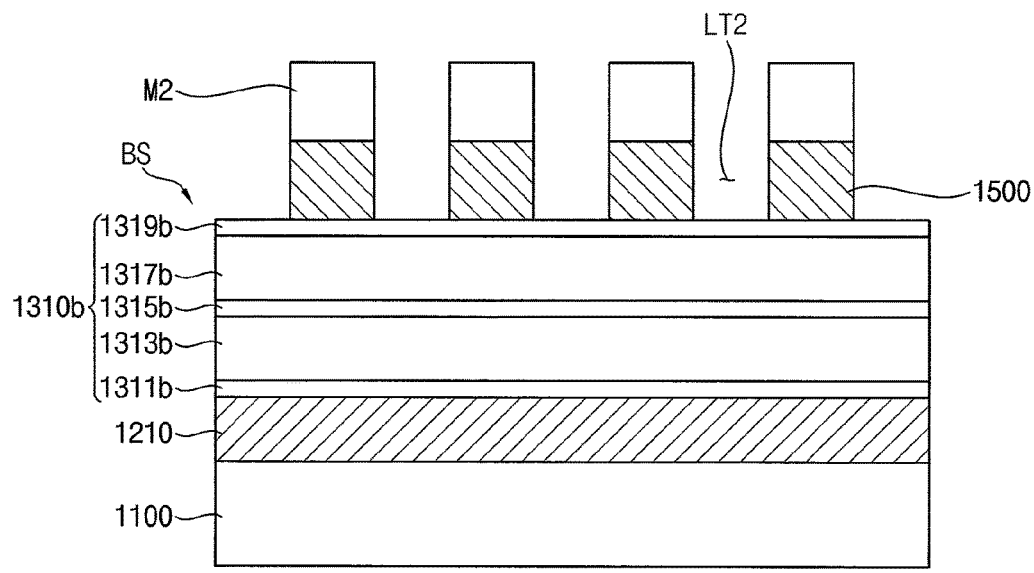
Figure 12B:
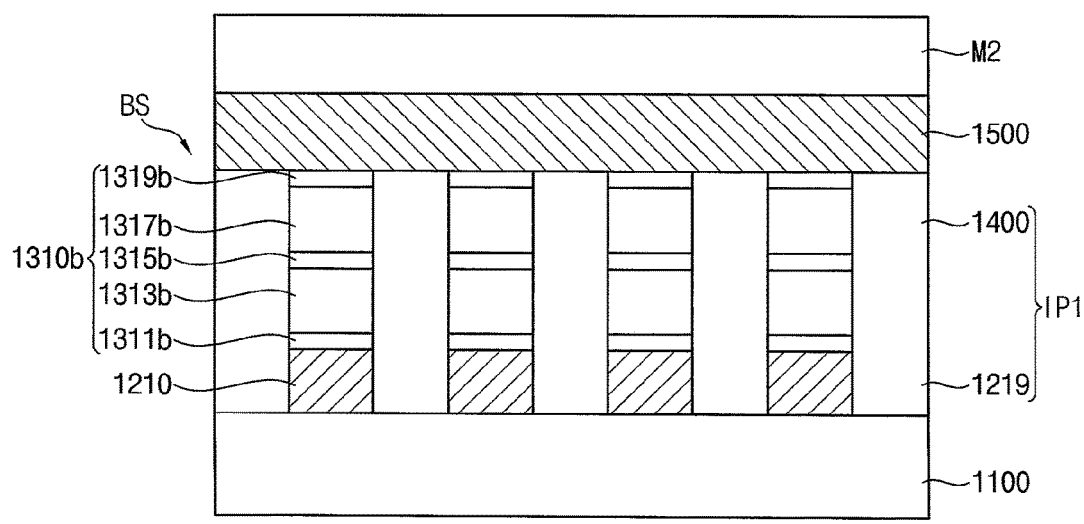

As shown in FIGS. 12A and 12B, the second conductive lines 1500 may be formed on the base structure BS in the second direction y.

For example, the second conductive layer 1500*a* may be partially removed from the base structure BS by an anisotropic etching process using the second mask pattern M2 as an etching mask until the first cell line 1310*b* may be exposed, thereby forming a second line trench LT2 extending in the second direction y. Therefore, the second conductive layer 1500*a* may be formed into the second conductive lines 1500 that may extend in the second direction y and may be spaced apart by the second line trench LT2 along the first direction x.

Since the second line trench LT2 may be shaped into a line extending in the second direction y, the first cell line 1310*b* and the first cell separate line 1400 may be alternately exposed through the second line trench LT2 along the second direction y.

In the present example embodiment, the second conductive layer 1500*a* may be etched off from the base structure BS by a reactive ion etching (ME) process.

Figure 13A:
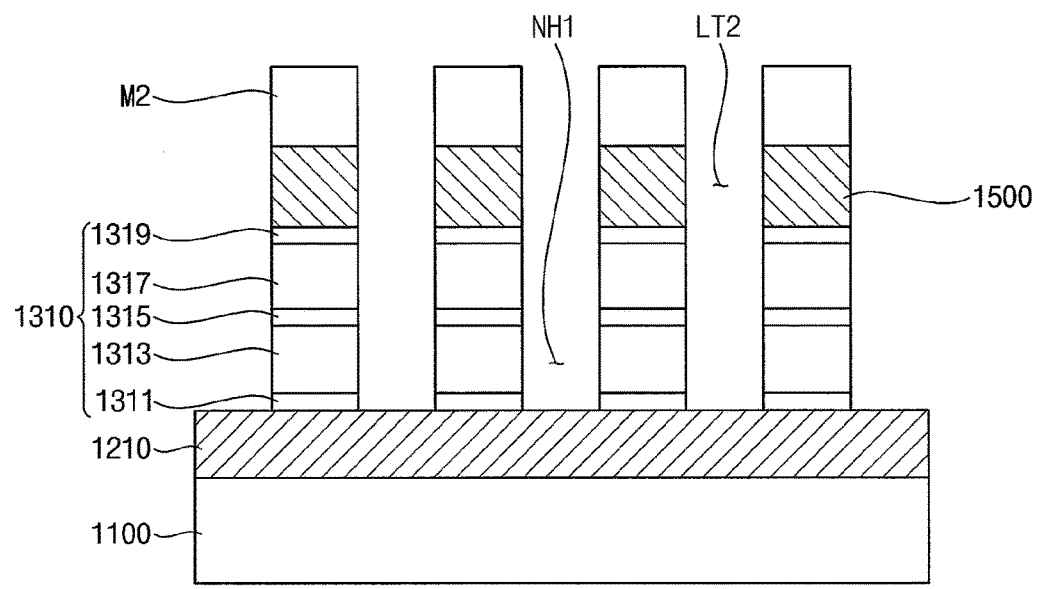
Figure 13B:
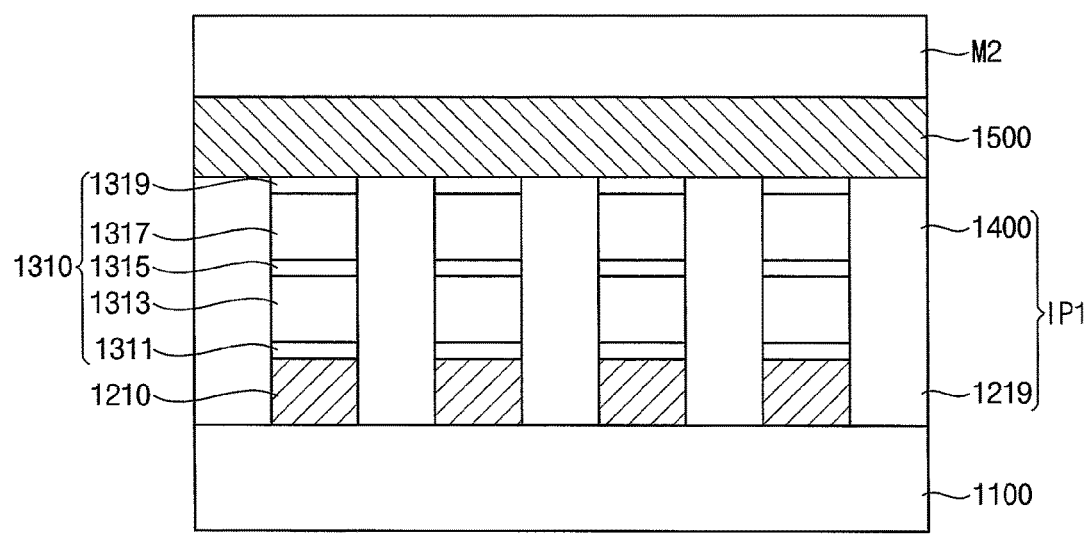

As shown in FIGS. 13A and 13B, the first cell line 1310*b* that may be exposed through the second line trench LT2 may be removed from the base structure BS to thereby form a first node separation hole NH1 through which the lower first conductive line 1210 may be exposed. For example, the first cell line 1310*b* may be removed by an anisotropic etching process having etching selectivity with respect to the first cell separation line 1400.

Particularly, since the first cell line 1310*b* may comprise metal-based material similar to the second conductive line

1500, the first cell line 1310b may be consecutively etched off after formation of the second line trench LT2 and the second conductive line 1500 just by changing the process conditions such as etching gases and a process temperature and pressure for the anisotropic etching process.

In the above etching process, the process conditions may be individually adjusted to each of the first to third electrode patterns 1311b, 1315b and 1319b, the phase changeable material pattern 1313b and the switching pattern 1317b in such a way that the contact resistance therebetween may be reduced.

Thus, the first cell line 1310b may be separated by the first node separation hole NH1 in the first direction x as well as be separated by the first cell separation line 1400 in the second direction y, so that the first cell line 1310b may be node-separated into a first cell memory structure 1310. That is, the first cell line 1310b may be formed into the first cell structure 1310 having a first electrode 1311, a data storage element 1313 including the phase changeable material, a second electrode 1315, a selection element 1317 and a third electrode 1319 by the etching process for forming the first node separation hole NH1. In addition, an upper surface of the lower first conductive line 1210 may be exposed through the first node separation hole NH1.

Figure 14A:
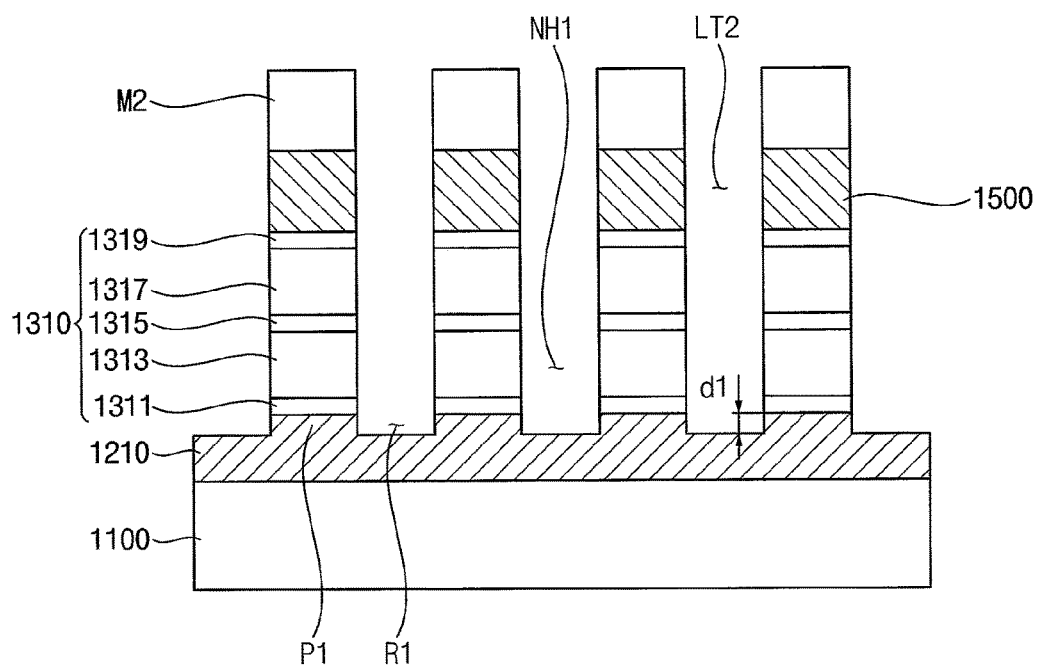
Figure 14B:
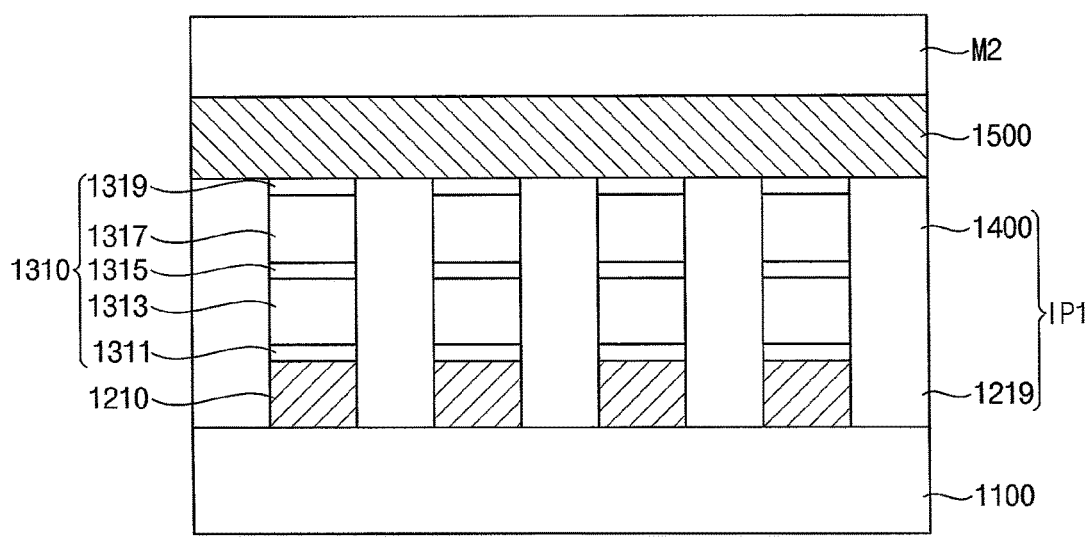

As shown in FIGS. 14A and 14B, the lower first conductive line 1210 exposed through the first node separation hole NH1 may be partially recessed, thereby forming a first recess R1 on the lower first conductive line 1210. Thus, the lower first conductive line 1210 may be formed into an uneven structure in which the first recesses R1 and first protrusions P1 may be alternately arranged at an upper portion thereof. The first protrusion P1 may be defined by the first recesses R1 and the first cell structure 1310 may be arranged on the first protrusion P1.

The lower first conductive line 1210 may be partially removed from the substrate 1100 by a dry or a wet etching process having an etching selectivity with respect to the first cell structure 1310 and the second conductive line 1500. For example, if the lower first conductive line 1210 includes a doped semiconductor layer or an epitaxial layer, the first recess R1 may be formed by a wet etching process having an etching selectivity with respect to the metal materials of the first cell structure 1310 and the second conductive line 1500.

In contrast, if the lower first conductive line 1210 comprises metal materials similar to the second conductive line 1500, the first recess R1 may be formed by a dry etching process such as a reactive ion etching (RIE) process. In such a case, the configurations of the first recess R1 may be easily modified just by changing the etching gases and the etching time.

Particularly, the dry etching process for forming the first recess R1 may be the same process as the etching process for forming the second line trench LT2 and the first node separation hole NH1, except for the variation of the etching conditions in view of a first depth d1 of the first recess R1 and the compositions and layer structure of the first cell structure 1310. Thus, the dry etching process for forming the first recess R1 may be conducted in the same process chamber as for the dry etching process for forming the second line trench LT2 and the first node separation hole NH1.

In the present example embodiment, the first recess R1 may be formed by the RIE process to have a first depth d1 in a range of about 5 nm to about 50 nm.

When the first depth d1 may be less than about 5 nm, the heat transfer path between the selection cell and the adjacent cell may be substantially insignificant and the thermal cross talk between the selection cell and the adjacent cell may be hardly protected by the first recess R1 of the first conductive line 1210. In contrast, when the first depth d1 may be more than about 50 nm, the aspect ratio of the first node separation hole NH1 may become so high that contact defects such as a void may be generated in the subsequently formed first thermal insulation plug 1610 in first node separation hole NH1. Accordingly, the first depth d1 may be controlled to be at least 5 nm, such as in a range of about 5 nm to about 50 nm. Further, to increase the distance of the thermally conductive path between adjacent first cell structures 1310, the depth d1 may be at least ¼ of the distance separating neighboring first cell structures 1310, thus increasing the thermally conductive path by at least 50% which would otherwise be formed by second conductive line 1210. For example, it may be beneficial to form the depth d1 to a depth of at least ¼ of the thickness (vertical height in FIG. 14A) of the first conductive line 1210 at locations of protrusions P1.

Figure 15A:
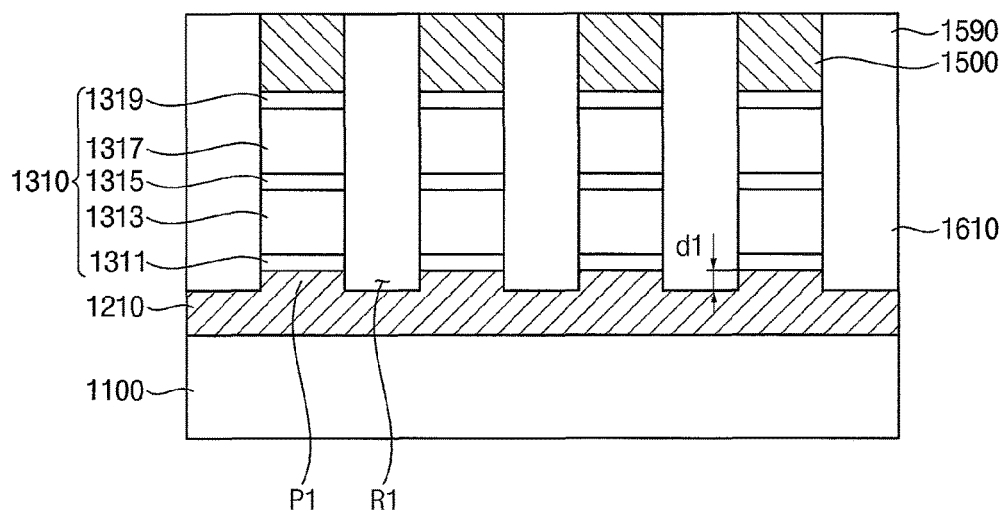
Figure 15B:
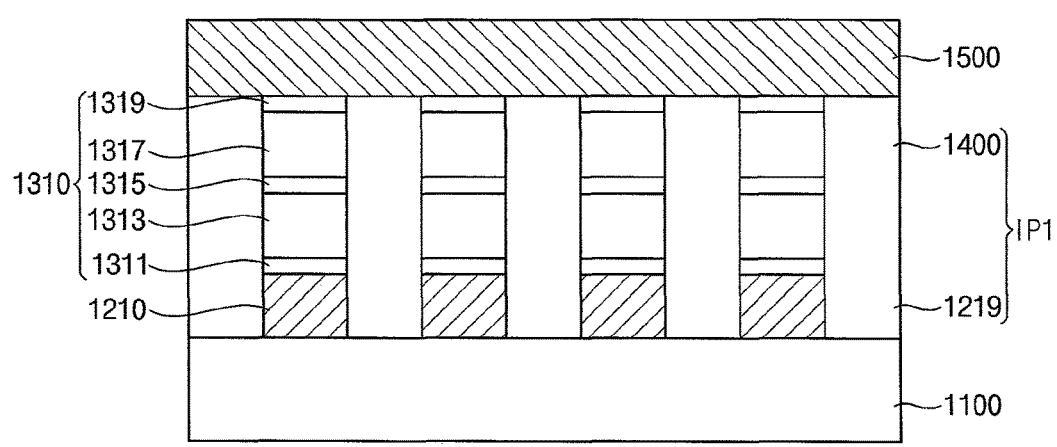

As shown in FIGS. 15A and 15B, a first thermal insulating plug 1610 may be formed in the first recess R1 and the first node separation hole NH1 and a second base separation line 1590 may be formed in the second line trench LT2. The first thermal insulation plug 1610 may constitute a node separation pattern 1600 of the semiconductor memory device 2000.

For example, an insulation layer (not shown) may be formed on the substrate 1100 by a deposition process to a sufficient thickness to fill up the second line trench LT2 and the first node separation hole NH1. Then, the insulation layer may be planarized until an upper surface of the second conductive line 1500 may be exposed, thereby forming the first thermal insulating plug 1610 and the second base separation line 1590 may be simultaneously formed on the substrate 1100.

Particularly, the first thermal insulating plug 1610 and the second base separation line 1590 may comprise the same insulation materials as the first cell separation line 1400, thus boundary stresses among the first thermal insulating plug 1610, the second base separation line 1590 and the first cell separation line 1400 may be reduced. For example, the first thermal insulating plug 1610 and the second base separation line 1590 may comprise silicon oxide, silicon nitride and silicon oxynitride.

While the present example embodiment discloses that the second base separation line 1590 may comprise the same insulation materials as the first thermal insulating plug 1610 in the same process, the first thermal insulating plug 1610 and the second base separation line 1590 may be individually formed in different processes with different insulation materials.

Accordingly, the first cell structures 1310 on the first protrusion P1 may be separated from each other in the first direction x by the first thermal insulating plug 1610 of which the bottom may be lower than a bottom surface of the first cell structure 1310. Although heat may be generated from the first electrode 1311 and the data storage element 1313 of the selection cell in the first cell structure 1310, the heat transfer path may be elongated as much as twice the first depth d1 of the first recess R1 and as a result, the heat transfer from the selection cell to the adjacent cell may be significantly reduced in the first cell structure 1310. Accordingly, the thermal cross talk between the selection cell and the adjacent cell may be reduced due to the first recess R1 of the lower first conductive line 1210, thereby increasing the operation reliability of the semiconductor memory device 2000.

Figure 16A:
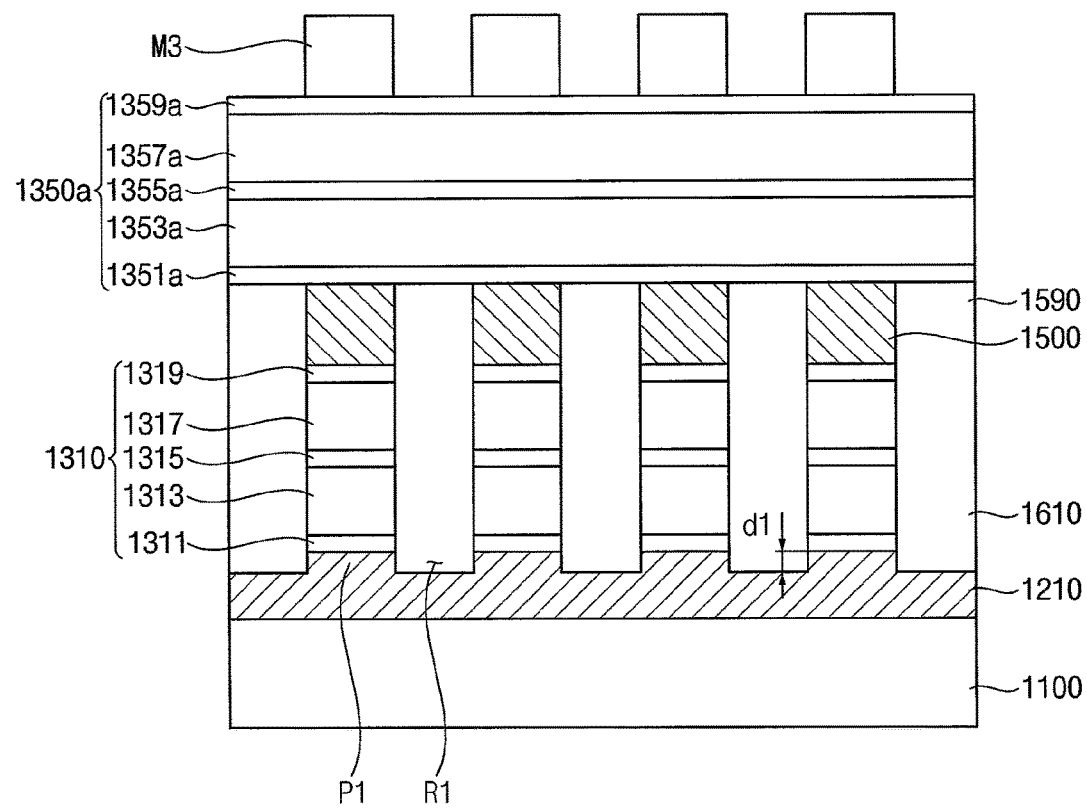
Figure 16B:
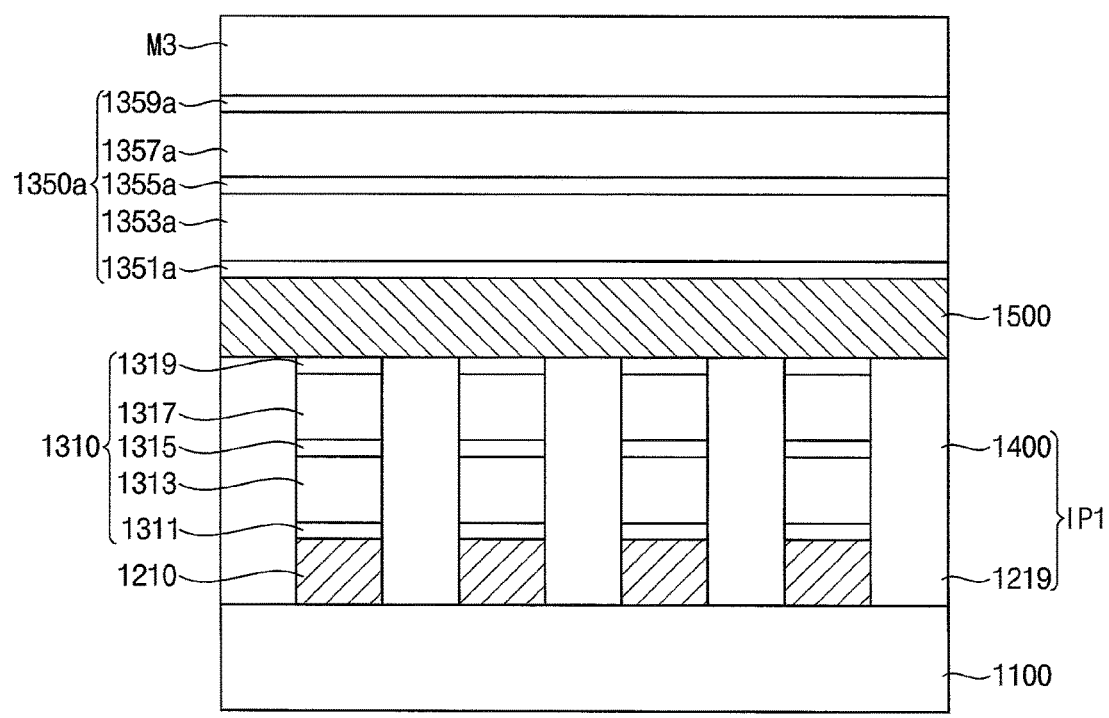

As shown in FIGS. 16A and 16B, a second multilayer 1350a may be formed on the substrate 1100 in such a way that the second conductive line 1500 and the second base separation line 1590 may be covered by the second multilayer 1350a. Then, a third mask pattern M3 may be formed on the second multilayer 1350a. The third mask pattern M3 may be formed into a plurality of lines extending in the second direction y and spaced apart along the first direction x.

The second multilayer 1350a may include the same materials and structures as the first multilayer 1310a and may be formed into the second cell structures 1350 in a subsequent process.

The second multilayer 1350a may be formed by the same process as for the first multilayer 1310a described in detail with reference to FIGS. 8A and 8B and the third mask pattern M3 may be formed by the same process as for the second mask pattern M2 described in detail with reference to FIGS. 12A and 12B. The third mask pattern M3 may have the same line pattern as the second conductive line 1500.

Figure 17A:
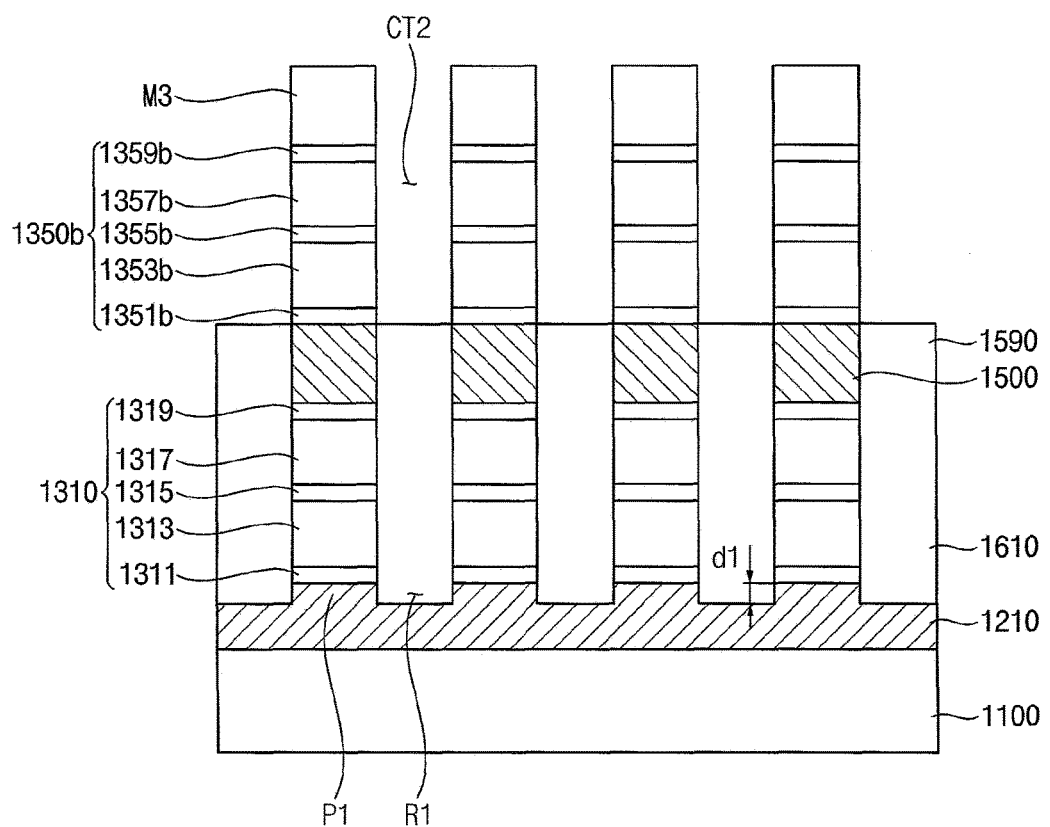
Figure 17B:
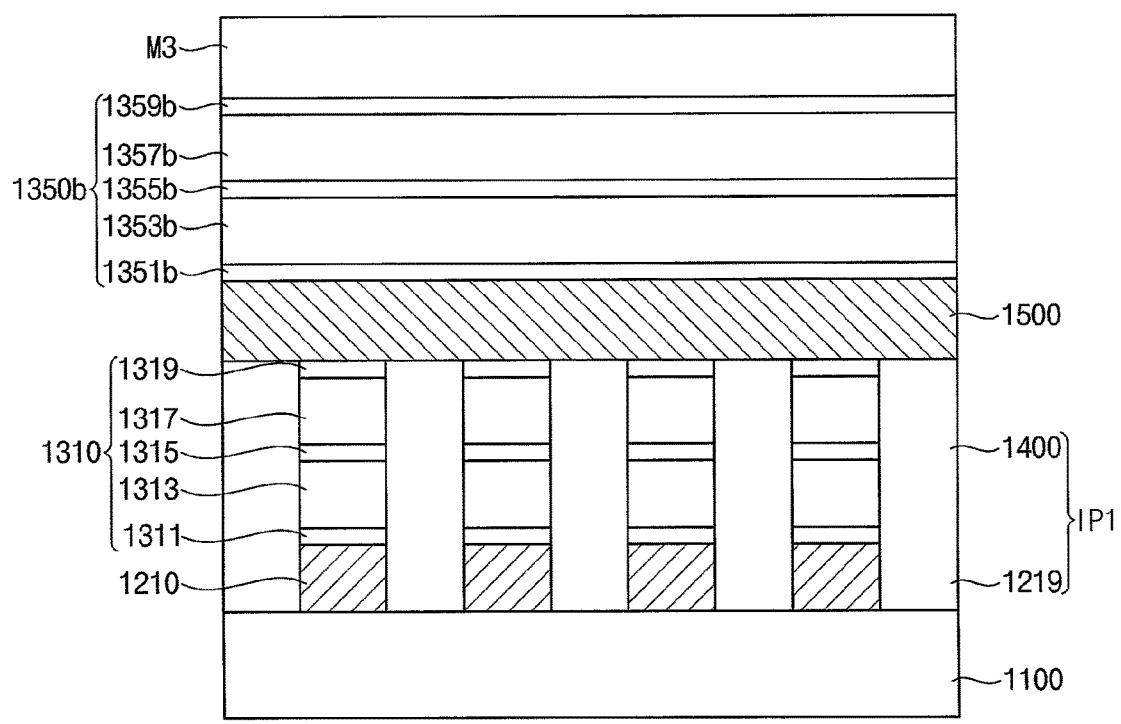

As shown in FIGS. 17A and 17B, the second multilayer 1350a may be partially removed from the substrate 1100 by an etching process using the third mask pattern M3 as an etching mask, thereby forming a second cell trench CT2 that may extend in the second direction y. Thus, the second multilayer 1350a may be formed into a plurality of second cell lines 1350b that may extend in the second direction y and spaced apart by the second cell trench CT2 along the first direction x. Thus, the second cell lines 1350b may also include a first electrode pattern 1351b, a phase changeable material pattern 1353b, a second electrode pattern 1355b, a switching pattern 1357b and a third electrode pattern 1359b just like the first cell lines 1310b.

Since the first and the second multilayers 1310a and 1350a may comprise the same structures and materials, the second cell trench CT2 may be formed by the same etching process as for the first cell trench CT1.

Figure 18A:
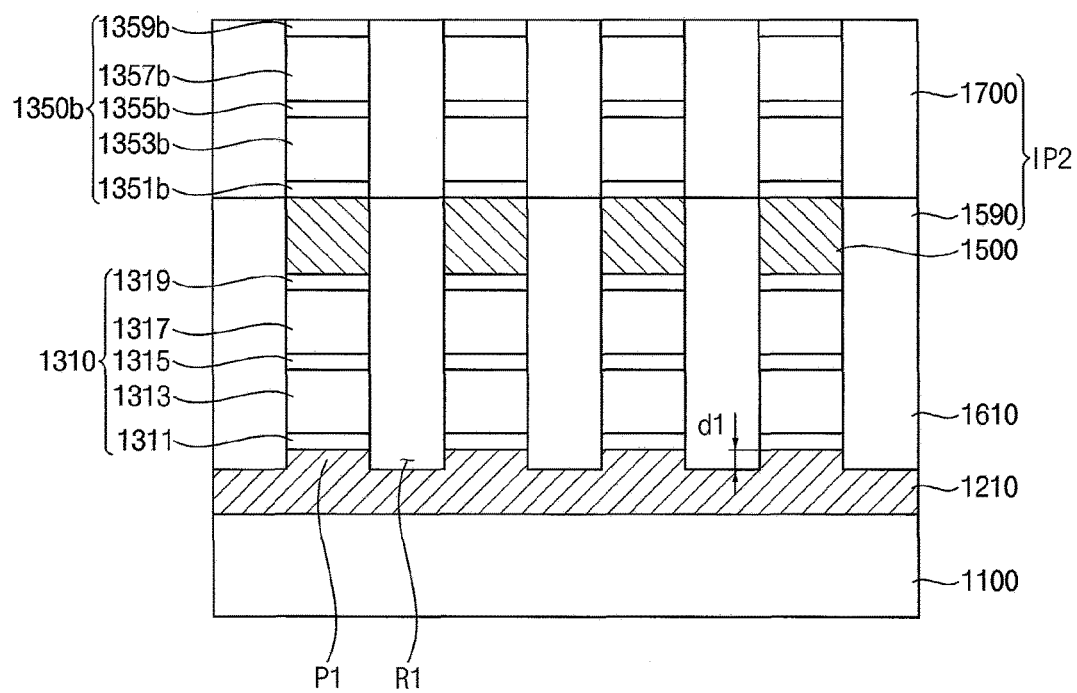
Figure 18B:
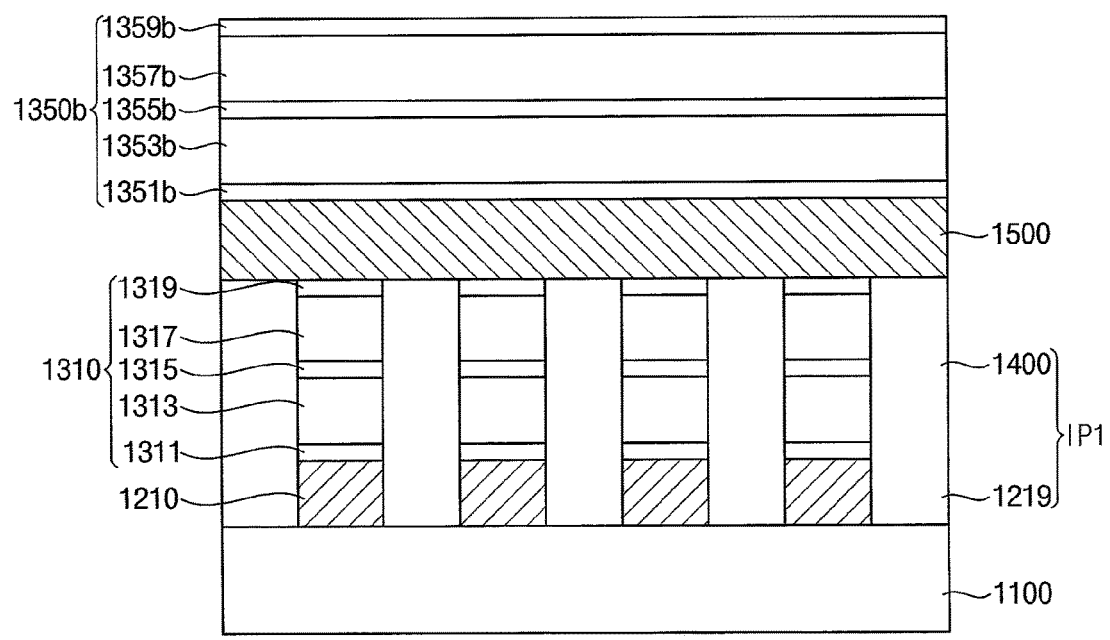

As shown in FIGS. 18A and 18B, a second cell separation line 1700 may be formed in the second cell trench CT2, thus the second cell lines 1350b may be separated from each other along the first direction x. In the present example embodiment, the second cell separation line 1700 may be arranged on the second base separation line 1590, thus the second cell separation line 1700 and the second base separation line 1590 may constitute a second insulation pattern IP2 of the semiconductor memory device 2000.

For example, an insulation layer (not shown) may be formed on the substrate 1100 to a sufficient thickness to fill up the second cell trench CT2, and then may be planarized until an upper surface of the second cell line 1350b. Thus, the insulation layer may remain just in the second cell trench CT2, thereby forming the second cell separation line 1700 on the substrate 1100.

Thus, the second cell lines 1350b and the second cell separation lines 1700 may be alternately arranged on the substrate along the first direction x, and the neighboring second cell lines 1350 may be separated from each other by the second cell separation line 1700.

Figure 19A:
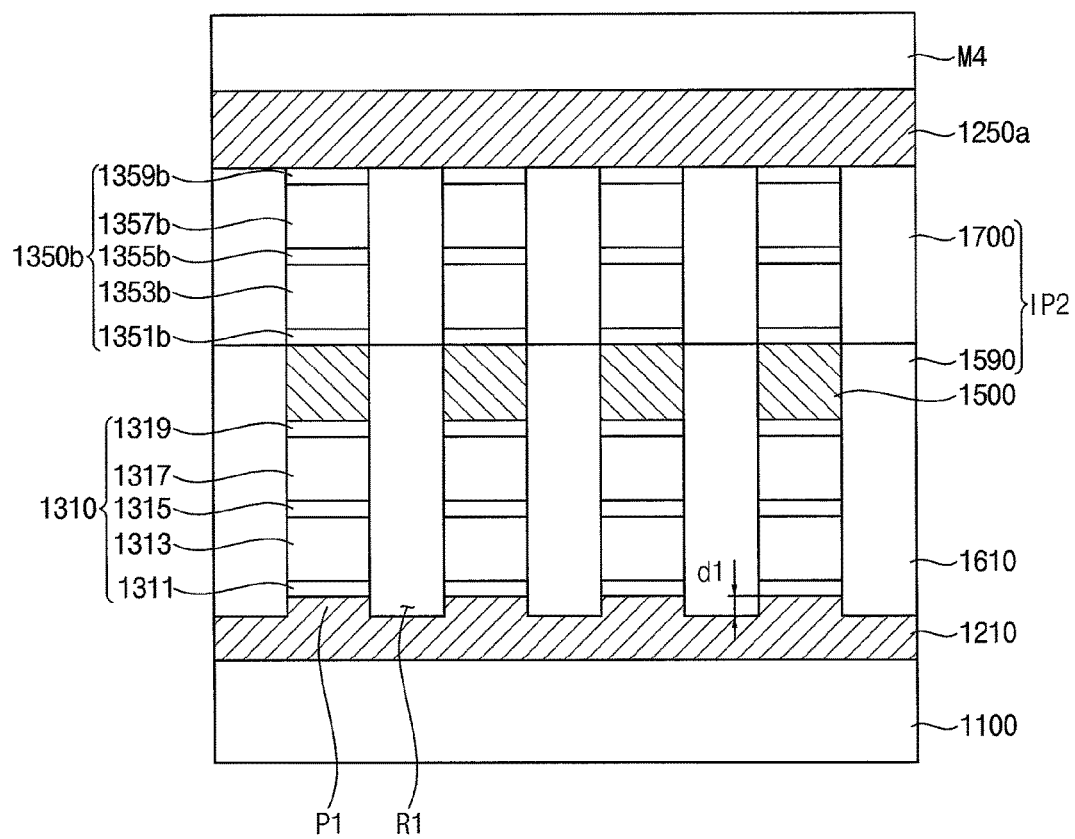
Figure 19B:
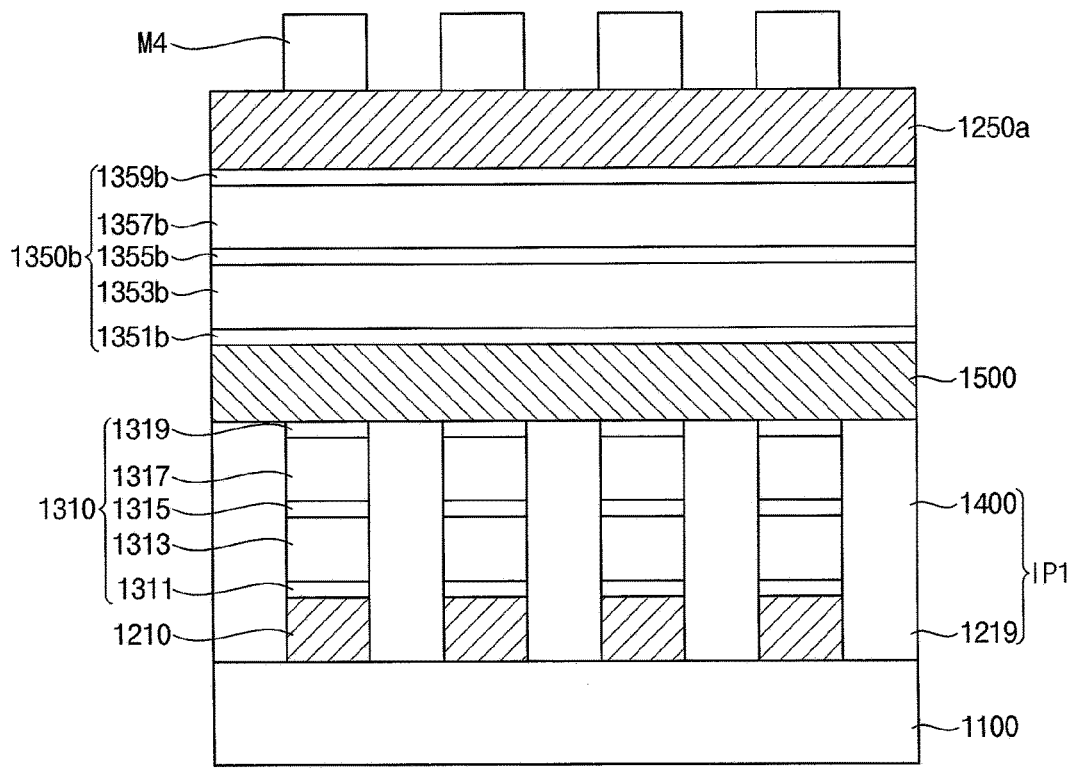

As shown in FIGS. 19A and 19B, an upper first conductive layer 1250a may be formed on the second cell lines 1350b and the second cell separation lines 1700, and then a fourth mask pattern M4 may be formed on the upper first conductive layer 1250a.

The upper first conductive layer 1250a may comprise the same materials as the lower first conductive layer 1210a by a deposition process. For example, low-resistive metals may be deposited onto the second cell lines 1350b and the second cell separation lines 1700 and some dopants or impurities may be implanted onto the low-resistive metal layer, thereby forming the upper first conductive layer 1250a. Otherwise, an expitaxial layer may be formed on the second cell lines 1350b and the second cell separation lines 1700 and some dopants or impurities may be implanted onto the epitaxial layer, thereby forming the upper first conductive layer 1250a.

In a modified example embodiment, since the third electrode pattern 1359b may be formed into a contact plug contacting with the upper first conductive line 1250 in a subsequent process, the third electrode pattern 1359b of the second cell line 1350b may be formed simultaneously with the upper first conductive line 1250a.

In the present example embodiment, the upper first conductive layer 1250a may be formed by a CVD process similar to the deposition process for forming the lower first conductive layer 1210a.

Figure 20A:
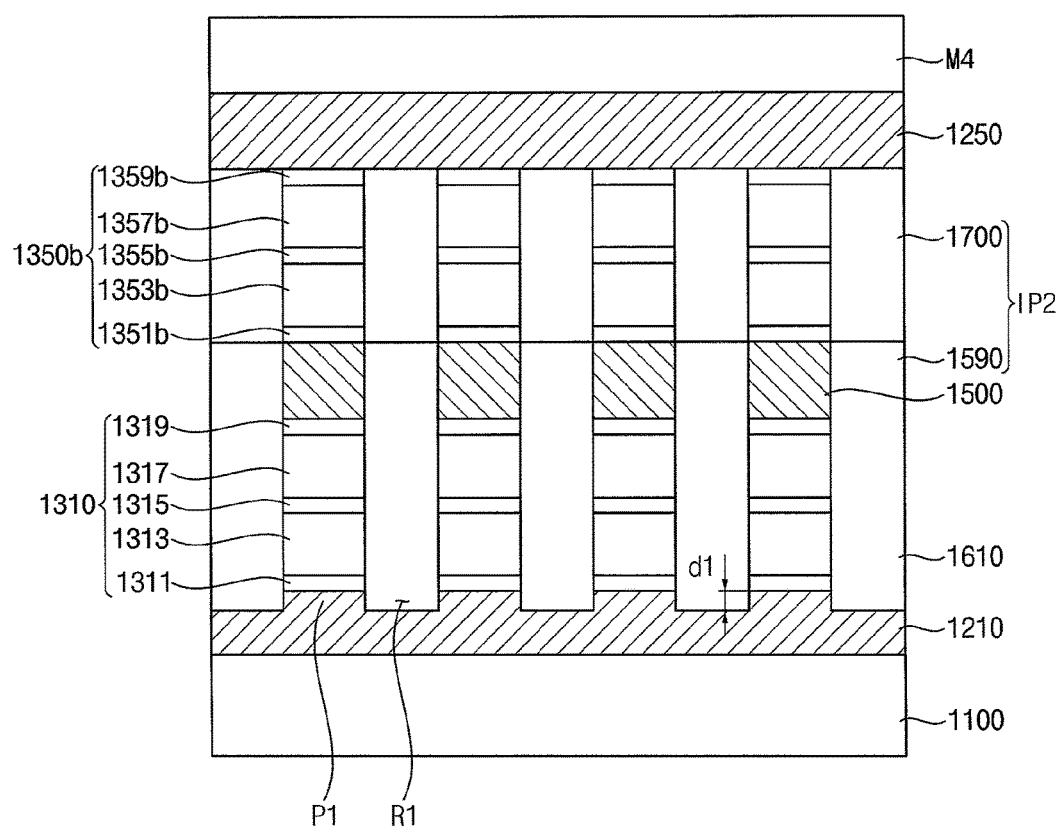
Figure 20B:
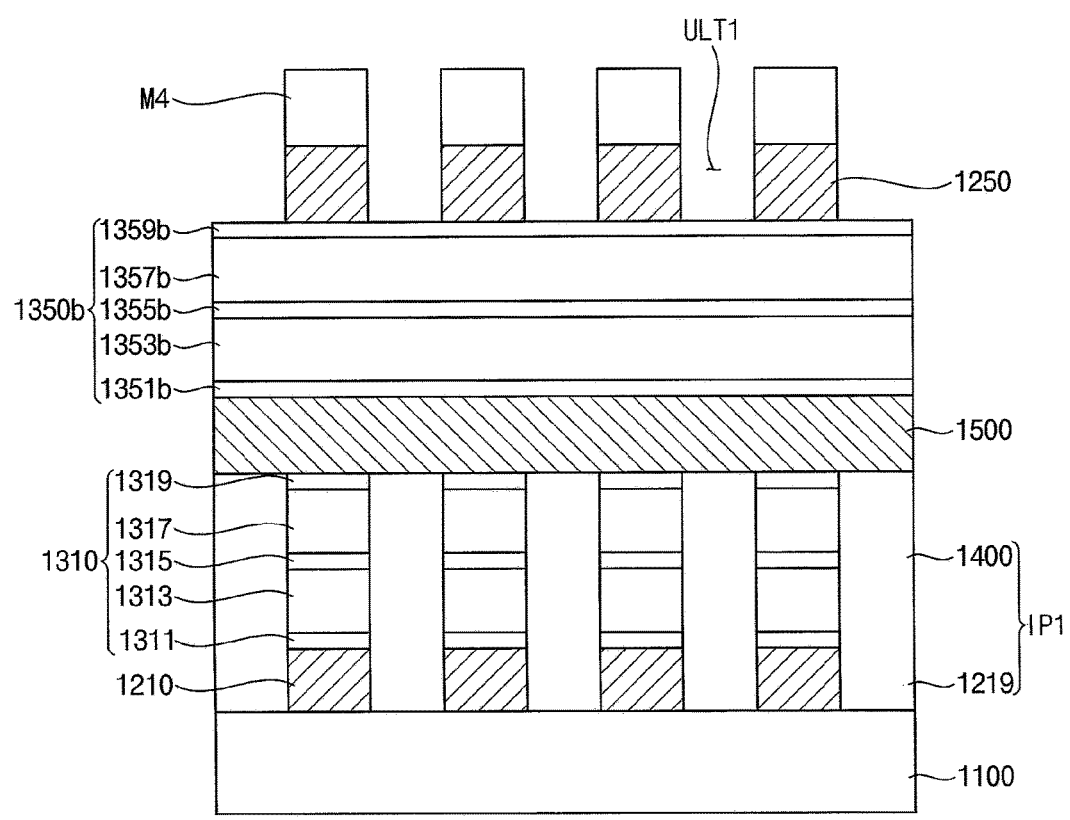

As shown in FIGS. 20A and 20B, a plurality of upper first conductive lines 1250 may be formed across the second cell lines 1350b and the second cell separation lines 1700. The upper first conductive lines 1250 may extend in the first direction x and spaced apart along the second direction y. The lower and upper first conductive lines 1210 and 1250 may constitute a first conductive line 1200 extending in the first direction x.

For example, the upper first conductive layer 1250a may be partially removed from the substrate 1100 by an anisotropic etching process using the fourth mask pattern M4 as an etching mask until the second cell line 1350b may be exposed, thereby forming an upper first line trench ULT1 extending in the first direction x. Therefore, the upper first conductive layer 1250a may be formed into the upper first conductive lines 1250 that may extend in the first direction x and may be spaced apart by the upper first line trench ULT1 along the second direction y.

In the present example embodiment, the upper first conductive layer 1250a may be etched off from the substrate 1100 by a reactive ion etching (ME) process.

Figure 21A:
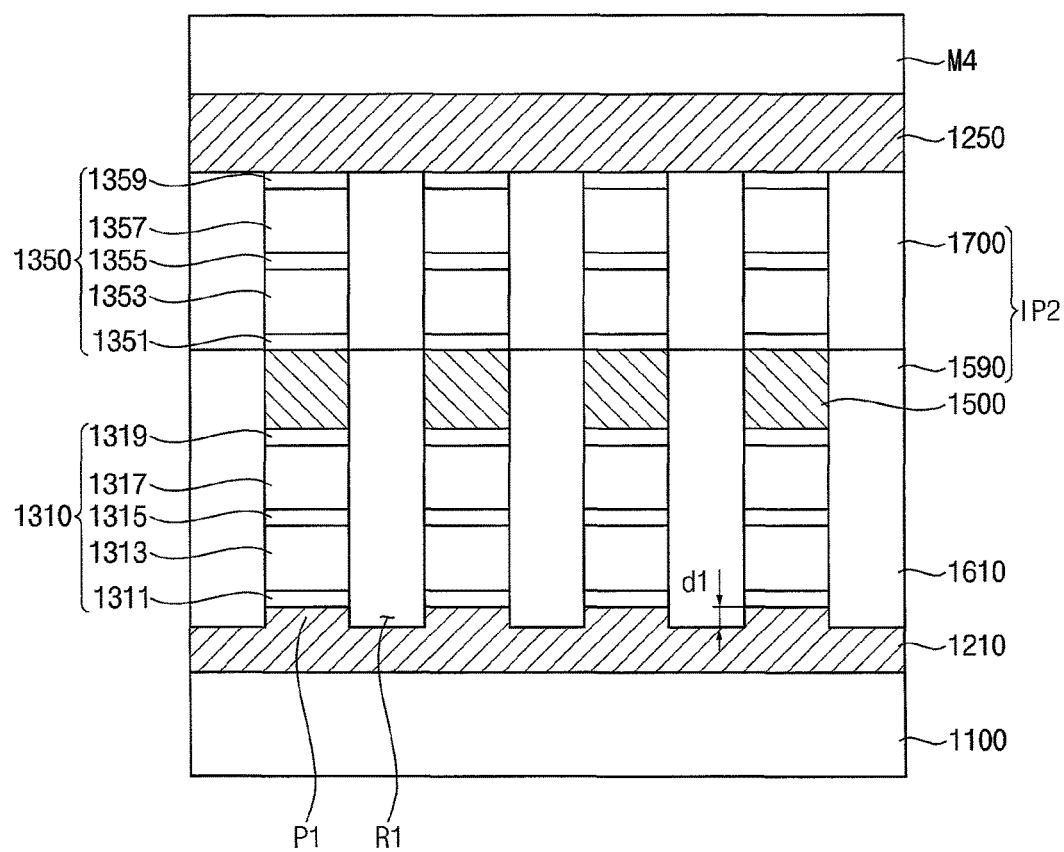
Figure 21B:
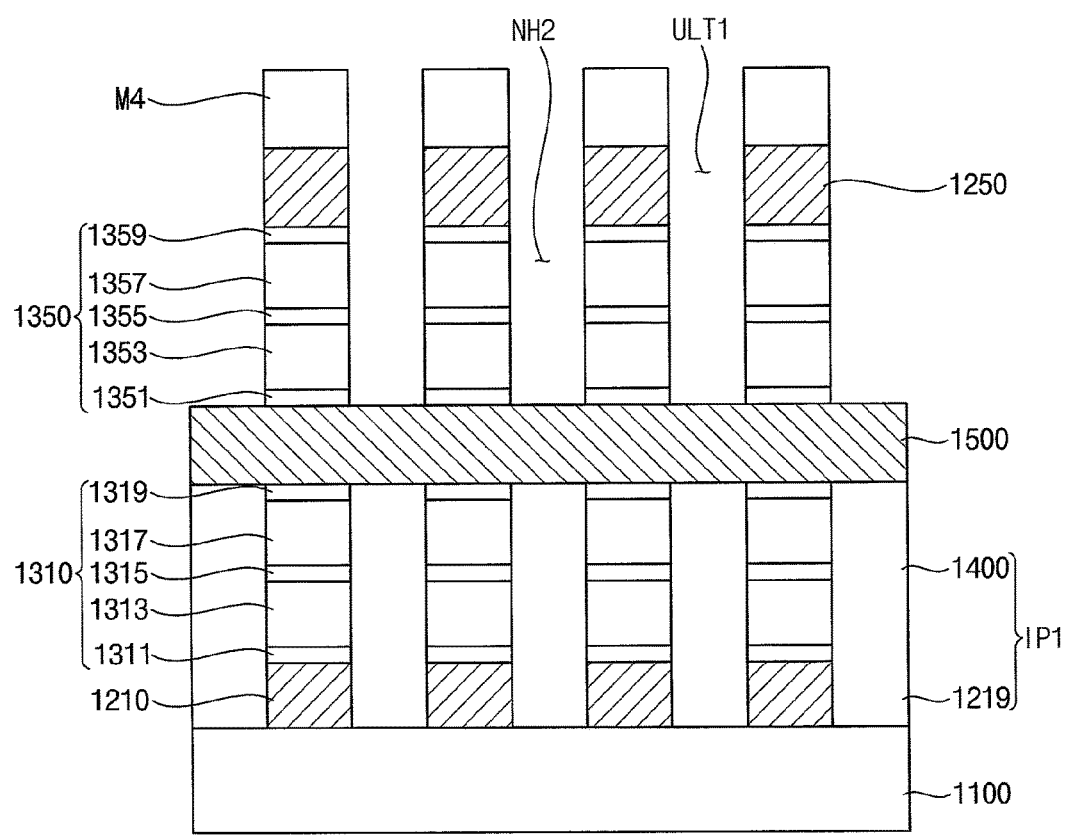

As shown in FIGS. 21A and 21B, the second cell line 1350b that may be exposed through the upper first line trench ULT1 may be removed from the substrate 1100 to thereby form a second node separation hole NH2 through which the second conductive line 1500 may be exposed. For example, the second cell line 1350b may be removed by an anisotropic etching process having etching selectivity with respect to the second cell separation line 1700.

Particularly, since the second cell line 1350b may comprise metal-based material similar to the upper first conductive line 1250, the second cell line 1350b may be consecutively etched off after formation of the upper first line trench ULT1 just by changing the process conditions such as etching gases and a process temperature and pressure for the anisotropic etching process.

Thus, the second cell line 1350b may be separated by the second node separation hole NH2 in the first direction x as well as be separated by the second cell separation line 1700 in the second direction y, so that the second cell line 1350b may be node-separated into a second cell memory structure 1350. That is, the second cell line 1350b may be formed into the second cell structure 1350 having a first electrode 1351, a data storage element 1353 including the phase changeable material, a second electrode 1355, a selection element 1357 and a third electrode 1359 by the etching process for forming the second node separation hole NH2. In addition, an upper surface of the second conductive line 1500 may be exposed through the second node separation hole NH2.

Figure 22A:
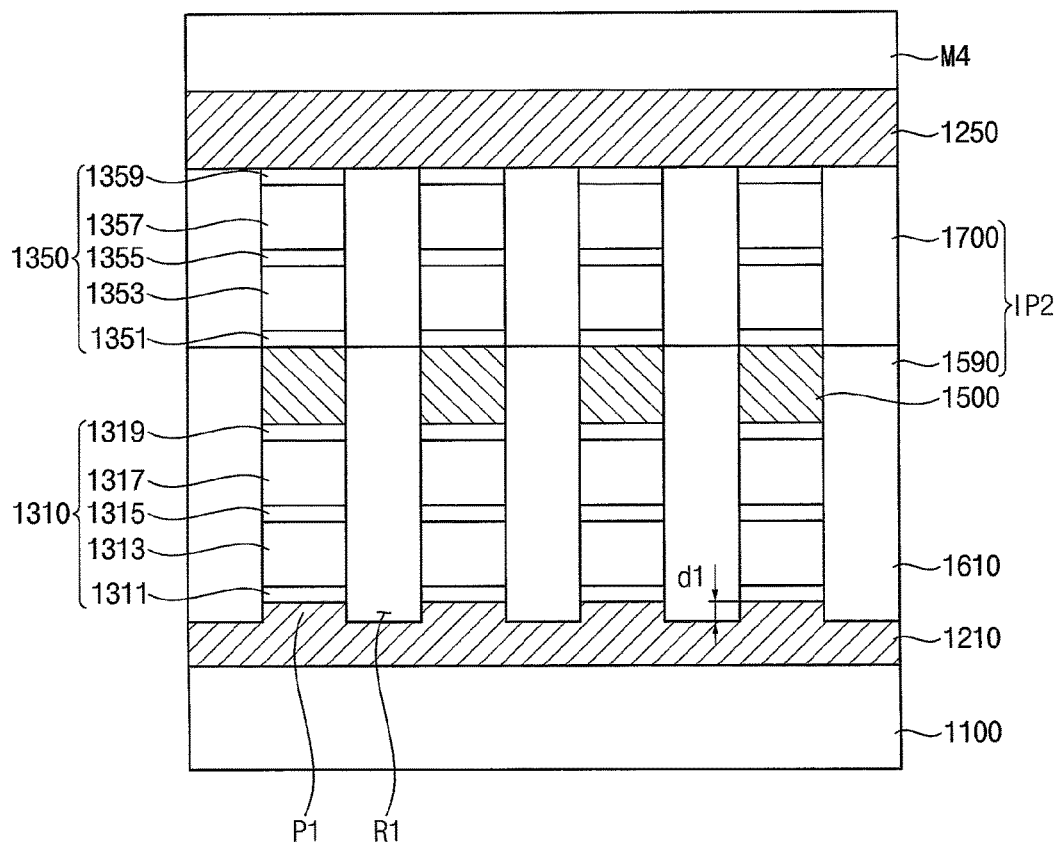
Figure 22B:
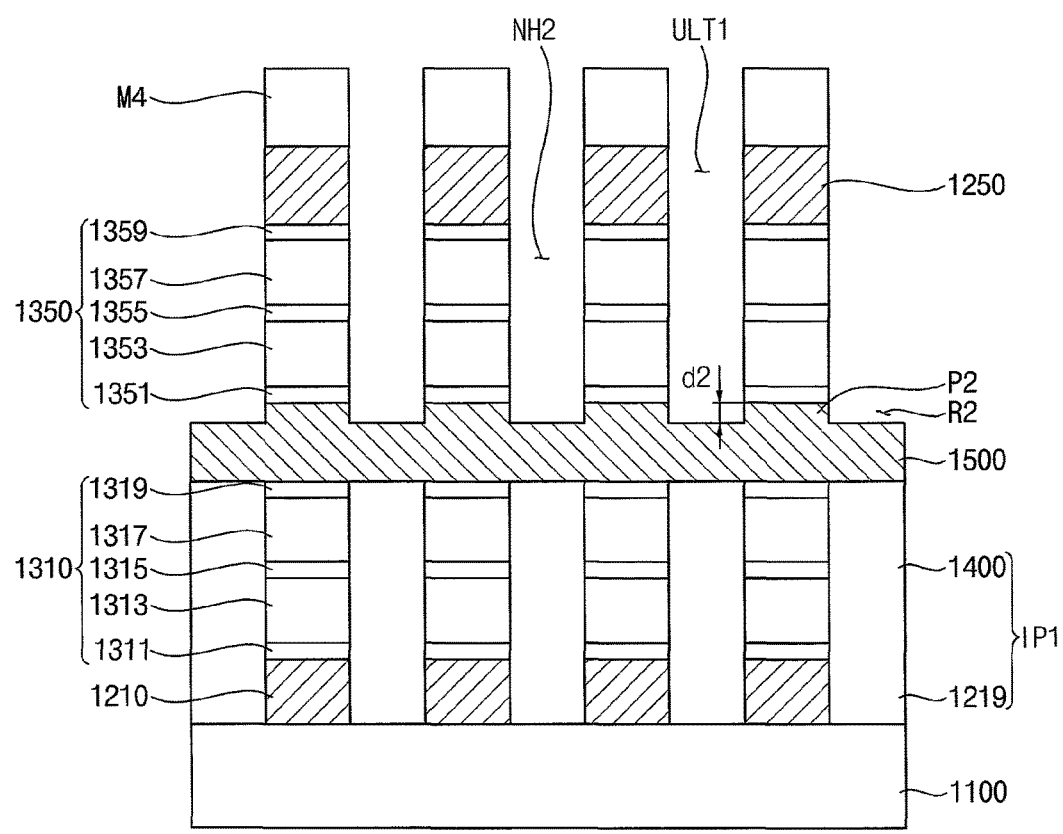

As shown in FIGS. 22A and 22B, the second conductive line 1500 exposed through the second node separation hole NH2 may be partially recessed, thereby forming a second recess R2 on the second conductive line 1500. Thus, the second conductive line 1500 may be formed into an uneven structure in which the second recesses R2 and second protrusions P2 may be alternately arranged at an upper portion thereof. The second protrusion P2 may be defined by the first recesses R1 and the second cell structure 1350 may be arranged on the second protrusion P2.

The second conductive line 1500 may be partially removed from the substrate 1100 by a dry or a wet etching process having an etching selectivity with respect to the second cell structure 1350 and the upper first conductive line 1250. For example, when the second conductive line 1500 may include a doped semiconductor layer or an epitaxial layer, the first recess R1 may be formed by a wet etching process having an etching selectivity with respect to the metal materials of the second cell structure 1350 and the upper first conductive line 1250.

In contrast, when the second conductive line 1500 may comprise metal materials similar to the upper first conductive line 1250, the second recess R2 may be formed by a dry etching process such as a reactive ion etching (RIE) process. In such a case, the configurations of the second recess R2 may be easily modified just by changing the etching gases and the etching time.

Particularly, the dry etching process for forming the second recess R2 may be the same process as the etching process for forming the upper first line trench ULT1 and the second node separation hole NH2, except for the variation of the etching conditions in view of a second depth d2 of the second recess R2 and the compositions and layer structure of the second cell structure 1350. Thus, the dry etching process for forming the second recess R2 may be conducted in the same process chamber as for the dry etching process for forming the upper first line trench ULT1 and the second node separation hole NH2.

In the present example embodiment, the second recess R2 may be formed by the RIE process to have the second depth d2 in a range of about 5 nm to about 50 nm just like the first depth d1 of the first recess R1. However, the second depth d2 may be different from the first depth d1. To increase the distance of the thermally conductive path between adjacent first cell structures 1310, the depth d2 may be at least ¼ of the distance separating neighboring first cell structures 1310, thus increasing the thermally conductive path by at least 50% which would otherwise be formed by second conductive line 1500. For example, it may be beneficial to form the depth d2 to a depth of at least ¼ of the thickness (vertical height in FIG. 14A) of the second conductive line at locations of protrusions P2.

Figure 23A:
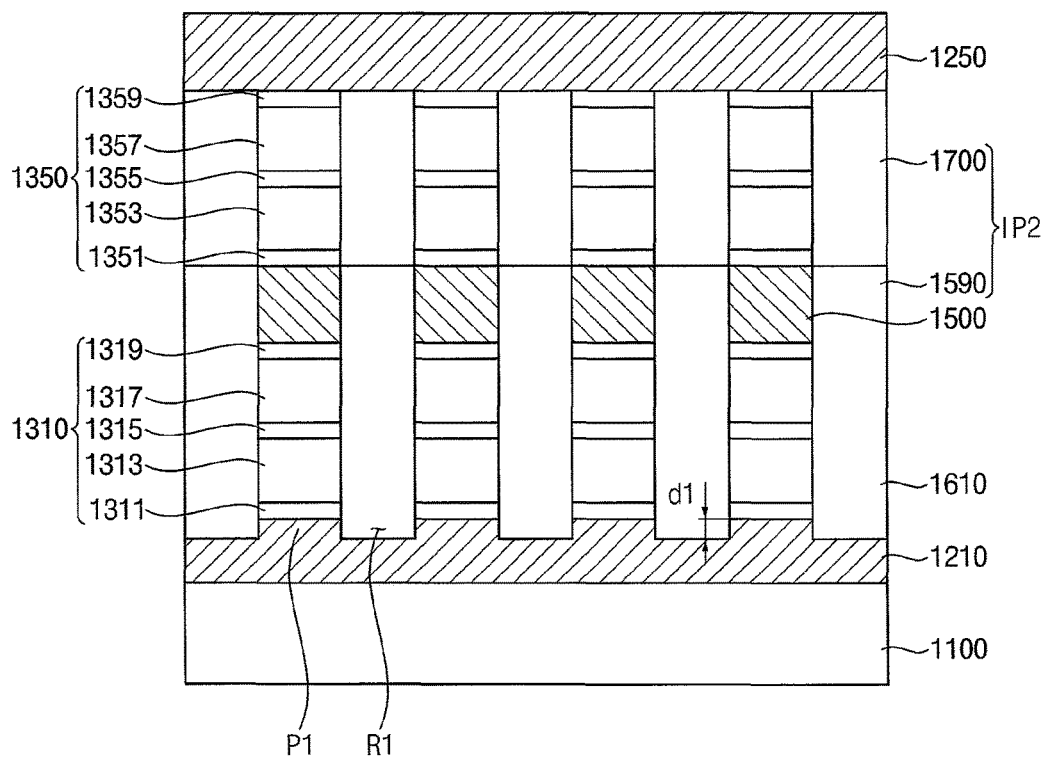
Figure 23B:
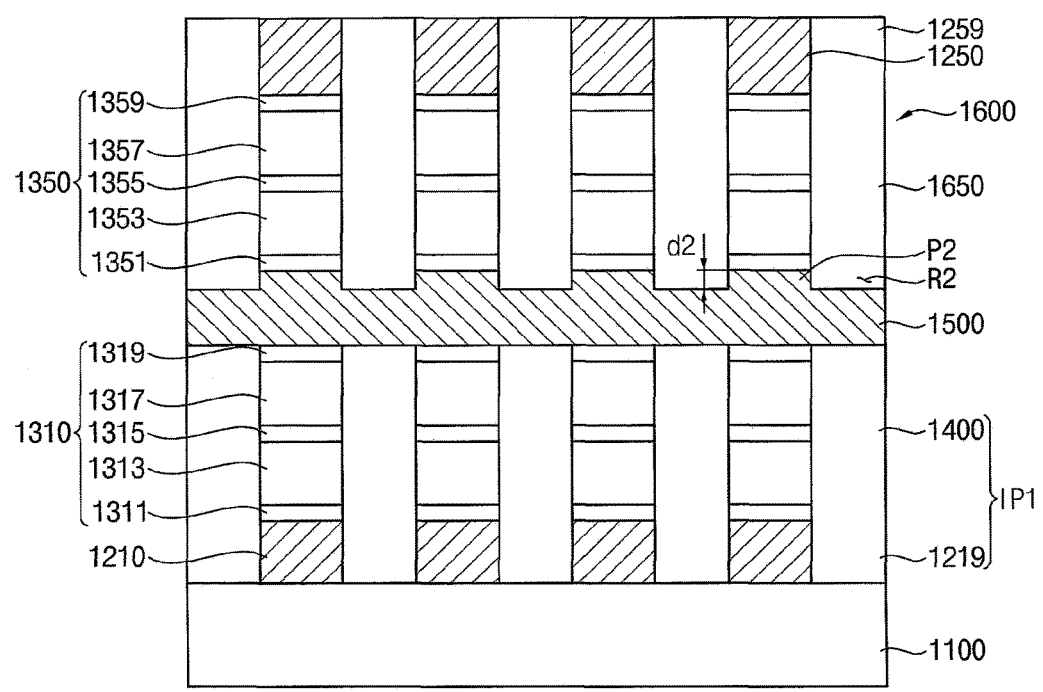

As shown in FIGS. 23A and 23B, a second thermal insulating plug 1650 may be formed in the second recess R2 and the second node separation hole NH2 and an upper first base separation line 1259 may be formed in the upper first line trench ULT1. The second thermal insulating plug 1650 may constitute a node separation pattern 1600 of the semiconductor memory device 2000 together with the first thermal insulating plug 1610.

For example, an insulation layer (not shown) may be formed on the substrate 1100 by a deposition process to a sufficient thickness to fill up the upper first line trench ULT1 and the second node separation hole NH2. Then, the insulation layer may be planarized until an upper surface of the upper first conductive line 1250 may be exposed, thereby forming the second thermal insulating plug 1650 and the upper first base separation line 1259 may be simultaneously formed on the substrate 1100.

Particularly, the second thermal insulating plug 1650 and the upper first base separation line 1259 may comprise the same insulation materials as the second cell separation line 1700, thus boundary stresses among the second thermal insulating plug 1650, the upper first base separation line 1259 and the second cell separation line 1700 may be reduced. For example, the second thermal insulating plug 1650 and the upper first base separation line 1259 may comprise silicon oxide, silicon nitride and silicon oxynitride.

Accordingly, the second cell structures 1350 on the second protrusion P2 may be separated from each other in the second direction y by the second thermal insulating plug 1650 of which the bottom may be lower than a bottom surface of the second cell structure 1350. Although heat may be generated from the first electrode 1351 and the data storage element 1353 of the selection cell in the second cell structure 1350, the heat transfer path may be elongated as much as twice the second depth d2 of the second recess R2 and as a result, the heat transfer from the selection cell to the adjacent cell may be significantly reduced in the second cell structure 1350. Accordingly, the thermal cross talk between the selection cell and the adjacent cell may be reduced due to the second recess R2 of the second conductive line 1500, thereby increasing the operation reliability of the semiconductor memory device 2000.

According to the example embodiments of the semiconductor memory device and a method of manufacturing the same, an alternate series of the recess and protrusion may be formed on the conductive lines and the cell structures may be arranged on the protrusions while the thermal insulating plugs may be arranged in the recesses. Since the bottom of the recess is lower than a top surface of the protrusion at each of the conductive lines 1200 and 1500, the thermal insulating plugs interposed between the neighboring cell structures along each conductive line may be lower than the bottom of the cell structures.

Thus, the heat transfer path between the neighboring cell structures may increase as much as twice the depth of the recess, to thereby reduce the thermal cross talk between the cell structures on the same conductive line.

Particularly, when the semiconductor memory device may include a three-dimensional cross point cell array and the cell pitch may decrease according to the high integration degree, the Joule's heat generated from the selection cell may tend to transfer to the adjacent cell on the same conductive line. Thus, the data state of the adjacent cell may be unexpectedly changed by the heat transferred from the selection cell (thermal cross talk), which may significantly reduce the reliability of the semiconductor memory device.

However, according to the semiconductor memory device of the present example embodiment, the recess may be arranged on the conductive line between the neighboring cell structures, so the heat transfer path between the selection cell and the adjacent cell may increase as much as twice the recess depth. Therefore, the thermal cross talk may be sufficiently prevented without any additional thermal protector between the selection cell and the adjacent cell.

While the present example embodiment discloses that the recesses may be provided on the conductive lines of the phase changeable RAM (PRAM) device, the present example embodiment may also be applied to any other memory devices as long as the data storage element may be provided with each memory cell and the heat generated from the data storage element in a selection cell may be transferred to an adjacent cell via the conductive line.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor memory device comprising:
   a plurality of first conductive metal lines each extending in a first direction and having a plurality of recesses formed on a top surface thereof to form a plurality of protrusions such that the protrusions and the recesses are alternately arranged in the first direction;
   a plurality of second conductive metal lines each extending in a second direction and disposed over the first conductive metal lines to cross over the first conductive metal lines at corresponding ones of the protrusions of the first conductive metal lines;
   a plurality of memory cells each disposed on a corresponding one of the plurality of protrusions of said first conductive metal lines and extending in a third direction to contact a corresponding one of the second conductive metal lines; and
   a plurality of thermal insulating plugs, each disposed in a corresponding one of said recesses of the first conductive metal lines.

2. The semiconductor memory device of claim 1, further comprising a first insulating pattern arranged between the a neighboring pair of the first conductive metal lines and comprising a first portion shaped into a line extending in the first direction such that the neighboring pair of first conductive metal lines are separated by the first portion of the first insulating pattern and comprising second portions forming at least some of the plurality of thermal insulating plugs.

3. The semiconductor memory device of claim 2, wherein a bottom surface of each thermal insulating plug contacts a corresponding first conductive metal line at a bottom surface of a corresponding recess.

4. The semiconductor memory device of claim 1, wherein each of the memory cells comprises a first electrode, a data storage element disposed on the first electrode, a second electrode disposed on the data storage element, a selection element disposed on the second electrode for changing a state of the data storage element, and a third electrode disposed between the selection element and a corresponding second conductive line.

5. The semiconductor memory device of claim 1, wherein the recesses have a depth ranging from 5 nm to 50 nm.

6. The semiconductor memory device of claim 1,
   wherein a surface of a portion of a corresponding one of the first conductive metal lines extends between an adjacent pair of the memory cells disposed on the corresponding one of the first conductive metal lines and forms a thermal pathway between the adjacent pair of memory cells, and
   wherein the minimum path length of the thermal pathway is at least 50% greater than the horizontal distance between the adjacent pair of the memory cells.

7. The semiconductor memory device of claim 1,
   wherein an adjacent pair of the memory cells are disposed on a corresponding one of the first metal conductive lines, have a corresponding one of the recesses formed therebetween, and are spaced apart from each other by a first distance, and
   wherein a depth of the corresponding one of the recesses is at least ¼ of the first distance.

8. The semiconductor memory device of claim 1, wherein the plurality of second conductive metal lines each extend in the second direction and having a plurality of recesses formed on a top surface thereof to form a plurality of second protrusions, the second protrusions and the second recesses of each second conductive metal line being alternately arranged in the second direction, the second conductive metal lines being spaced apart in the first direction and stacked over the plurality of first conductive metal lines to cross over the first metal conductive lines at locations over corresponding ones of the first protrusions.

9. A semiconductor memory device comprising:
   a plurality of first conductive metal lines each extending in a first direction on a substrate and having a plurality of first recesses formed on a top surface thereof to form a plurality of first protrusions, the first protrusions and the first recesses being alternately arranged in the first direction and the first conductive metal lines being spaced apart in a second direction;
   a plurality of second conductive metal lines each extending in the second direction and having a plurality of second recesses formed on a top surface thereof to form a plurality of second protrusions, the second protrusions and the second recesses of each second conductive metal line being alternately arranged in the second direction, the second conductive metal lines being spaced apart in the first direction and stacked over the plurality of first conductive metal lines to cross over the first metal conductive lines at locations over corresponding ones of the first protrusions;
   a plurality of first memory cell structures positioned on the first protrusions such that the first memory cell structures are stacked between the first and the second conductive metal lines;
   a plurality of second memory cell structures positioned on the second protrusions; and
   a plurality of first thermal insulating plugs and a plurality of second thermal insulating plugs, each of the first thermal insulating plugs being positioned in a corresponding one of the first recesses and reducing heat transfer between a corresponding pair of neighboring ones of the first memory cell structures and each of the second thermal insulating plugs being positioned in a corresponding one of the second recesses of the second conductive metal line and reducing heat transfer between a corresponding pair of neighboring ones of the second memory cell structures.

10. The semiconductor memory device of claim 9, further comprising:

a first base separation line disposed between a neighboring pair of the first conductive metal lines and extending in the first direction such that the neighboring pair of first conductive metal lines are electrically separated from each other in the second direction;

a first cell separation line on the first base separation line and extending in the first direction such that neighboring first memory cell structures on the neighboring pair of the first conductive metal lines are electrically separated in the second direction;

a second base separation line disposed between a neighboring pair of the second conductive metal lines and extending in the second direction such that the neighboring pair of the second conductive metal lines are electrically separated from each other in the first direction; and a second cell separation line on the second base separation line and extending in the second direction such that neighboring second memory cell structures on the neighboring pair of the second conductive metal lines are electrically separated along in first direction.

11. The semiconductor memory device of claim 10,
wherein the second base separation line covers at least some of the first thermal insulating plugs and the first cell separation line has an upper surface that is coplanar with an upper surfaces of the second protrusions of the neighboring pair of the second conductive metal lines.

12. The semiconductor memory device of claim 11, wherein the first thermal insulating plugs and the second base separation line are formed as one homogeneous body.

13. The semiconductor memory device of claim 10, wherein each of the first and second memory cell structures includes a first electrode, a data storage element on the first electrode, a selection element configured to change a data state of the data storage element and a second electrode interposed between the data storage element and the selection element.

14. The semiconductor memory device of claim 13, wherein the selection element includes one of a vertical PN junction diode, a Schottky diode and an ovonic threshold switch (OTS).

15. The semiconductor memory device of claim 14, wherein the OTS includes a material selected from the group consisting of arsenic (As), germanium (Ge), selenium (Se), tellurium (Te), silicon (Si), bismuth (Bi), sodium (S), antimony (Sb) and in combinations thereof.

16. The semiconductor memory device of claim 13, wherein the data storage element includes a material selected from the group consisting of Ge—Sb—Te, Ge—Te—As, Sn—Te—Sn, Ge—Te, Sb—Te, Se—Te—Sn, Ge—Te—Se, Sb—Se—Bi, Ge—Bi-Te, Ge—Te—Ti, In—Se, Ga—Te—Se, In—Sb—Te, Bi—Sb—Te and in combinations thereof.

17. The semiconductor memory device of claim 13, wherein the first electrode includes a material selected from the group consisting of tungsten (W), titanium (Ti), aluminum (Al), copper (Cu), carbon (C), carbon nitride (CN), titanium nitride (TiN), titanium aluminum nitride (TiAlN), titanium silicon nitride (TiSiN), titanium carbon nitride (TiCN), tungsten nitride (WN), cobalt silicon nitride (CoSiN), tungsten silicon nitride (WSiN), tantalum nitride (TaN), tantalum carbon nitride (TaCN), tantalum silicon nitride (TaSiN) and in combinations thereof.

18. The semiconductor memory device of claim 13, wherein each of the first memory cell structures further comprises a third electrode interposed between the selection element and the second conductive metal line.

19. The semiconductor memory device of claim 9,
wherein an adjacent pair of the memory cells are disposed on a corresponding one of the first metal conductive lines, have a corresponding one of the recesses formed therebetween, and are spaced apart from each other by a first distance, and wherein a depth of the corresponding one of the recesses is at least ¼ of the first distance.

20. The semiconductor memory device of claim 9,
wherein a surface of a portion of a corresponding one of the first conductive metal lines extends between an adjacent pair of the memory cells disposed on the corresponding one of the first metal conductive metal lines and forms a thermal pathway between the adjacent pair of memory cells, and wherein the minimum path length of the thermal pathway is at least 50% greater than the horizontal distance between the adjacent pair of the memory cells.

* * * * *